US009193067B2

(12) United States Patent
Fujimura et al.

(10) Patent No.: US 9,193,067 B2
(45) Date of Patent: Nov. 24, 2015

(54) ROTATION-TRANSMITTING MECHANISM, CONVEYING APPARATUS, AND DRIVING APPARATUS

(75) Inventors: Kazuhiro Fujimura, Fujisawa (JP); Hirofumi Minami, Chigasaki (JP)

(73) Assignees: SOWA MD CENTER CO., LTD, Kanagawa (JP); ULVAC, INC

( * ) Notice: Subject to any disclaimer, the term of this patent is extended or adjusted under 35 U.S.C. 154(b) by 695 days.

(21) Appl. No.: 13/384,903

(22) PCT Filed: Jul. 20, 2010

(86) PCT No.: PCT/JP2010/004651
§ 371 (c)(1),
(2), (4) Date: Apr. 16, 2012

(87) PCT Pub. No.: WO2011/010448
PCT Pub. Date: Jan. 27, 2011

(65) Prior Publication Data
US 2012/0251287 A1    Oct. 4, 2012

(30) Foreign Application Priority Data

Jul. 22, 2009    (JP) .................................. 2009-171524

(51) Int. Cl.
*F16H 1/46*    (2006.01)
*B25J 9/10*    (2006.01)
(Continued)

(52) U.S. Cl.
CPC . *B25J 9/102* (2013.01); *F16H 1/46* (2013.01); *F16H 37/041* (2013.01); *H01L 21/67742* (2013.01)

(58) Field of Classification Search
CPC ......... B25J 9/102; B25J 17/0241; F16H 1/28; F16H 1/2809; F16H 1/46; F16H 3/46; F16H 3/54; F16H 3/663; F16H 3/666; F16H 37/041; F16H 37/047; F16H 37/048; F16H 37/0826; F16H 48/10; F16H 48/11; F16H 57/082; F16H 2001/327; F16H 2037/047; F16H 2037/048; F16H 2048/104; F16H 2048/106; F16H 2055/176; F16H 2200/2007; F16H 2200/2023; F16H 2200/2025; F16H 2200/2028; H01L 21/67742; Y10S 414/13
USPC ............... 74/10.52; 414/744.5, 917; 475/149, 475/150, 331, 332, 334, 338, 341, 342, 903
See application file for complete search history.

(56) References Cited

U.S. PATENT DOCUMENTS 1,777,490 A * 10/1930 Hardie .......................... 475/337
3,108,498 A * 10/1963 Hedin et al. ...................... 475/5
(Continued)

FOREIGN PATENT DOCUMENTS

GB    1 436 491 A    5/1976
JP    2002-021957 A    1/2002
(Continued)

OTHER PUBLICATIONS

International Search Report from the International Bureau of WIPO for International Application No. PCT/JP2010/004651 dated Oct. 19, 2010 (2 pages) and an English translation of the same (2 pages).

*Primary Examiner* — Saul Rodriguez
*Assistant Examiner* — Brendan Tighe
(74) *Attorney, Agent, or Firm* — Fitch Even Tabin & Flannery LLP

(57) ABSTRACT

A rotation-transmitting mechanism capable of obtaining a high deceleration ratio in a small number of stages, and a conveying apparatus and driving apparatus using the rotation-transmitting mechanism are provided. In one form, a rotation-transmitting mechanism includes an inner rotating body and an outer rotating body arranged coaxially with the inner rotating body. Further, the rotation-transmitting mechanism includes a driving rotating body and rotating body arranged on an input side (lower stage), and two planetary rotating bodies arranged on an output side (upper stage). When the driving rotating body is rotated by a motor on the input side, the two planetary rotating bodies revolve around the inner rotating body while rotating on the output side. At this time, the planetary rotating bodies revolve very slowly around the inner rotating body.

9 Claims, 11 Drawing Sheets

(51) Int. Cl.
  *F16H 37/04*  (2006.01)
  *H01L 21/677*  (2006.01)

(56) References Cited

U.S. PATENT DOCUMENTS 3,824,875 A * 7/1974 Willert et al. ............ 74/665 GA
6,190,114 B1 * 2/2001 Ogawa et al. .............. 414/744.5
6,729,201 B2 * 5/2004 Mori et al. ................. 74/490.01
2010/0120574 A1 * 5/2010 Maekawa ..................... 475/331
2011/0009232 A1 * 1/2011 Kapelevich ................... 475/331

FOREIGN PATENT DOCUMENTS

| JP | 2002-081515 A | 3/2002 |
| JP | 2002-161949 A | 6/2002 |
| JP | 2002-349643 A | 12/2002 |
| JP | 2008-275112 A | 11/2008 |

\* cited by examiner

| Rotating body | Radius |
|---|---|
| Driving rotating body | $R_{in}$ = 5mm |
| Inner rotating body (input side) | $R_{11}$ = 50mm |
| Inner rotating body (output side) | $R_{12}$ = 40mm |
| Outer rotating body (input side) | $R_{21}$ = 60mm |
| Outer rotating body (output side) | $R_{22}$ = 50mm |
| Planetary rotating body | $R_3$ = 5mm |

FIG.3

| Gear | Pitch circle radius | Number of teeth |
|---|---|---|
| Driving gear | $R_{in}$ = 5mm | $N_{in}$ = 20 |
| Sun gear (input side) | $R_{11}$ = 50mm | $N_{11}$ = 200 |
| Sun gear (output side) | $R_{12}$ = 40mm | $N_{12}$ = 160 |
| Ring gear (input side) | $R_{21}$ = 60mm | $N_{21}$ = 240 |
| Ring gear (output side) | $R_{22}$ = 50mm | $N_{22}$ = 200 |
| Planetary gear | $R_3$ = 5mm | $N_3$ = 20 |

FIG.5

ROTATION-TRANSMITTING MECHANISM, CONVEYING APPARATUS, AND DRIVING APPARATUS

CROSS-REFERENCE TO A RELATED APPLICATIONS

This application is a U.S. national phase application filed under 35 U.S.C. §371 of International Application PCT/JP2010/004651, filed on Jul. 20, 2010, designating the United States, which claims priority from JP 2009-171524, filed on Jul. 22, 2009, which are hereby incorporated herein by reference in their entirety.

TECHNICAL FIELD

The present invention relates to a rotation-transmitting mechanism, and a conveying apparatus and driving apparatus using the rotation-transmitting mechanism.

BACKGROUND ART

Conventionally, deceleration mechanisms using planetary gears are widely used in various technical fields.

For example, Japanese Patent Application Laid-open No. 2002-349643 (paragraphs [0026] and [0027], FIG. 1) describes a deceleration mechanism including a rotatable sun gear, a planetary gear that revolves around the sun gear while rotating, and a planetary carrier that converts the revolution of the planetary gear into rotation of a sun gear in the next stage. The deceleration mechanism is formed by superposing the sun gears (including input axis) and the planetary gears and planetary carriers (including output axis) in three stages in an axial direction, and decelerates the rotation of a rotation axis (input axis) of a motor in a stepwise manner and takes out the rotation from the output axis.

Incidentally, in the deceleration mechanisms used in precision equipment or the like required for control with high precision, a high deceleration ratio is required in many cases. However, if a high deceleration ratio is intended to be obtained using the structure of the deceleration mechanism in Japanese Patent Application Laid-open No. 2002-349643, it is necessary to superpose the planetary gears and the like in the axial direction in many stages. Further, if a high deceleration ratio is intended to be obtained without increasing the number of deceleration stages, the width in a radial direction becomes large, and there arises a problem that the downsizing is difficult.

SUMMARY OF THE INVENTION

In view of the circumstances as described above, it is an object of the present invention to provide a rotation-transmitting mechanism capable of obtaining a high deceleration ratio in a small number of deceleration stages and easily downsized, and a conveying apparatus and driving apparatus using the rotation-transmitting mechanism.

To achieve the above-mentioned object, according to an embodiment of the present invention, there is provided a rotation-transmitting mechanism with a first stage and a second stage, including a first rotating body, a second rotating body, a driving rotating body, and a plurality of planetary rotating bodies.

The first rotating body includes a first outer circumferential portion and a second outer circumferential portion.

The first outer circumferential portion is provided in the first stage.

The second outer circumferential portion is provided in the second stage.

The second rotating body includes a first inner circumferential portion and a second inner circumferential portion.

The first inner circumferential portion is opposed to the first outer circumferential portion in the first stage.

The second inner circumferential portion is opposed to the second outer circumferential portion in the second stage.

The driving rotating body is brought into contact with the first outer circumferential portion and the first inner circumferential portion in the first stage and rotated by a drive source.

The planetary rotating bodies are brought into contact with the second outer circumferential portion and the second inner circumferential portion in the second stage and revolve around the first rotating body.

In the present invention, when the driving rotating body is rotated by the drive source, the second rotating body in contact with the driving rotating body in the first inner circumferential portion is rotated in one direction (for example, this rotation is referred to as positive rotation). Further, the first rotating body in contact with the driving rotating body on the first outer circumferential surface is rotated in a rotation direction opposite to the one direction (for example, this rotation is referred to as inverse rotation).

In this case, the plurality of planetary rotating bodies are brought into contact with the second outer circumferential portion of the first rotating body and the second inner circumferential portion of the second rotating body in the second stage. Therefore, the plurality of planetary rotating bodies revolve around the first rotating body while rotating (for example, this revolution is referred to as positive revolution). At this time, a slight difference is generated between absolute rotation speeds in the second inner circumferential portion and the second outer circumferential portion, with the result that the planetary rotating bodies can be revolved very slowly around the first rotating body.

Accordingly, in the rotation-transmitting mechanism according to the embodiment of the present invention, a high deceleration ratio can be obtained. Further, in the present invention, a high deceleration ratio can be obtained in two stages, with the result that the downsizing of the rotation-transmitting mechanism is easily performed.

According to an embodiment of the present invention, there is provided a conveying apparatus including an arm mechanism and a first rotation-transmitting mechanism.

The arm mechanism includes a placing portion for placing an object to be conveyed and is extensible.

The first rotation-transmitting mechanism is a first rotation-transmitting mechanism with a first stage and a second stage and includes a first rotating body, a second rotating body, a driving rotating body, and an output portion.

The first rotating body includes a first outer circumferential portion and a second outer circumferential portion.

The first outer circumferential portion is provided in the first stage.

The second outer circumferential portion is provided in the second stage.

The second rotating body includes a first inner circumferential portion and a second inner circumferential portion.

The first inner circumferential portion is opposed to the first outer circumferential portion in the first stage.

The second inner circumferential portion is opposed to the second outer circumferential portion in the second stage.

The driving rotating body is brought into contact with the first outer circumferential portion and the first inner circumferential portion in the first stage and rotated by a drive source.

The planetary rotating bodies are brought into contact with the second outer circumferential portion and the second inner circumferential portion in the second stage and revolve around the first rotating body.

The output portion outputs revolution movements of the plurality of planetary rotating bodies to the arm mechanism so that the arm mechanism is extended and retracted.

In the present invention, the arm mechanism can be extended and retracted by the first rotation-transmitting mechanism having a high deceleration ratio, with the result that the extension and retraction operation of the arm mechanism can be controlled with high precision.

According to an embodiment of the present invention, there is provided a driving apparatus including a rotation-transmitting mechanism and a driven unit.

The rotation-transmitting mechanism is a rotation-transmitting mechanism with a first stage and a second stage and includes a first rotating body, a second rotating body, a driving rotating body, and a plurality of planetary rotating bodies.

The first rotating body includes a first outer circumferential portion and a second outer circumferential portion.

The first outer circumferential portion is provided in the first stage.

The second outer circumferential portion is provided in the second stage.

The second rotating body includes a first inner circumferential portion and a second inner circumferential portion.

The first inner circumferential portion is opposed to the first outer circumferential portion in the first stage.

The second inner circumferential portion is opposed to the second outer circumferential portion in the second stage.

The driving rotating body is brought into contact with the first outer circumferential portion and the first inner circumferential portion in the first stage and rotated by a drive source.

The planetary rotating bodies are brought into contact with the second outer circumferential portion and the second inner circumferential portion in the second stage and revolve around the first rotating body.

The driven unit is driven by an output of the rotation-transmitting mechanism due to the revolution of the planetary rotating bodies.

As described above, according to the present invention, it is possible to provide a rotation-transmitting mechanism capable of obtaining a high deceleration ratio in a small number of deceleration stages and easily downsized, and a conveying apparatus and driving apparatus using the rotation-transmitting mechanism.

BRIEF DESCRIPTION OF THE DRAWINGS

FIG. 3 is a diagram showing an example of a radius (inner diameter or outer diameter) of each of rotating bodies included in the rotation-transmitting mechanism according to the embodiment of the present invention.

FIG. 5 is a diagram showing an example of a combination of a pitch circle radius and the number of teeth in each gear included in the rotation-transmitting mechanism according to another embodiment.

DETAILED DESCRIPTION OF THE PREFERRED EMBODIMENTS

Figure 1A:
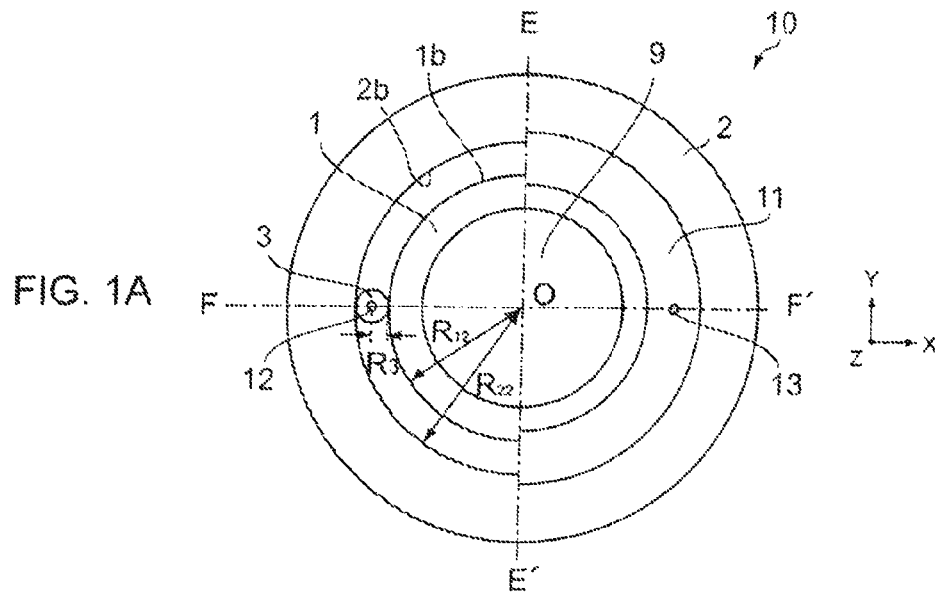
FIGS. 1A-1C are diagrams showing a rotation-transmitting mechanism according to an embodiment of the present invention.

According to an embodiment of the present invention, there is provided a rotation-transmitting mechanism with a first stage and a second stage, including a first rotating body, a second rotating body, a driving rotating body, and a plurality of planetary rotating bodies.

The first rotating body includes a first outer circumferential portion and a second outer circumferential portion.

The first outer circumferential portion is provided in the first stage.

The second outer circumferential portion is provided in the second stage.

The second rotating body includes a first inner circumferential portion and a second inner circumferential portion.

The first inner circumferential portion is opposed to the first outer circumferential portion in the first stage.

The second inner circumferential portion is opposed to the second outer circumferential portion in the second stage.

The driving rotating body is brought into contact with the first outer circumferential portion and the first inner circumferential portion in the first stage and rotated by a drive source.

The planetary rotating bodies are brought into contact with the second outer circumferential portion and the second inner circumferential portion in the second stage and revolve around the first rotating body.

In the present invention, when the driving rotating body is rotated by the drive source, the second rotating body in contact with the driving rotating body in the first inner circumferential portion is rotated in one direction. Further, the first rotating body in contact with the driving rotating body on the first outer circumferential surface is rotated and driven in a rotation direction opposite to the one direction.

In this case, the plurality of planetary rotating bodies are brought into contact with the second outer circumferential portion of the first rotating body and the second inner circumferential portion of the second rotating body in the second stage. Therefore, the plurality of planetary rotating bodies revolve around the first rotating body while rotating. At this time, a slight difference is generated between absolute rotation speeds in the second inner circumferential portion and the second outer circumferential portion, with the result that the planetary rotating bodies can be revolved very slowly around the first rotating body.

Accordingly, in the rotation-transmitting mechanism according to the embodiment of the present invention, a high deceleration ratio can be obtained. Further, in the present invention, a high deceleration ratio can be obtained in two stages, with the result that the downsizing of the rotation-transmitting mechanism is easily performed.

In the rotation-transmitting mechanism, the first rotating body may further include a top surface, a bottom surface, and a through-hole that passes through the top surface and the bottom surface.

In the present invention, by providing the through-hole to the second rotating body, it is possible to use the through-hole in various applications as, for example, a hole for passing wiring such as cables, a pipe for cold water, or the like there through.

In the rotation-transmitting mechanism, the first rotating body, the second rotating body, the driving rotating body, and the planetary rotating bodies may be formed of gears.

According to an embodiment of the present invention, there is provided a conveying apparatus including an arm mechanism and a first rotation-transmitting mechanism.

The arm mechanism includes a placing portion for placing an object to be conveyed and is extensible.

The first rotation-transmitting mechanism is a first rotation-transmitting mechanism with a first stage and a second stage and includes a first rotating body, a second rotating body, a driving rotating body, and an output portion.

The first rotating body includes a first outer circumferential portion and a second outer circumferential portion.

The first outer circumferential portion is provided in the first stage.

The second outer circumferential portion is provided in the second stage.

The second rotating body includes a first inner circumferential portion and a second inner circumferential portion.

The first inner circumferential portion is opposed to the first outer circumferential portion in the first stage.

The second inner circumferential portion is opposed to the second outer circumferential portion in the second stage.

The driving rotating body is brought into contact with the first outer circumferential portion and the first inner circumferential portion in the first stage and rotated by a drive source.

The planetary rotating bodies are brought into contact with the second outer circumferential portion and the second inner circumferential portion in the second stage and revolve around the first rotating body.

The output portion outputs revolution movements of the plurality of planetary rotating bodies to the arm mechanism so that the arm mechanism is extended and retracted.

In the present invention, the arm mechanism can be extended and retracted by the first rotation-transmitting mechanism having a high deceleration ratio, with the result that the extension and retraction operation of the arm mechanism can be controlled with high precision.

The conveying apparatus may further include a second rotation-transmitting mechanism.

The second rotation-transmitting mechanism is a second rotation-transmitting mechanism with a first stage and a second stage and includes a first rotating body, a second rotating body, a driving rotating body, a plurality of planetary rotating bodies, and an output portion.

The first rotating body includes a first outer circumferential portion and a second outer circumferential portion.

The first outer circumferential portion is provided in the first stage.

The second outer circumferential portion is provided in the second stage.

The second rotating body includes a first inner circumferential portion and a second inner circumferential portion.

The first inner circumferential portion is opposed to the first outer circumferential portion in the first stage.

The second inner circumferential portion is opposed to the second outer circumferential portion in the second stage.

The driving rotating body is brought into contact with the first outer circumferential portion and the first inner circumferential portion in the first stage and rotated by a drive source.

The planetary rotating bodies are brought into contact with the second outer circumferential portion and the second inner circumferential portion in the second stage and revolve around the first rotating body.

The output portion outputs revolution movements of the plurality of planetary rotating bodies to the arm mechanism so that the arm mechanism is turned.

In the present invention, the arm mechanism can be turned by the second rotation-transmitting mechanism having a high deceleration ratio, with the result that the turning operation of the arm mechanism can be controlled with high precision.

The conveying apparatus may further include an inner shaft and an outer shaft.

The inner shaft is rotatable and transmits a rotation movement of the output portion of the first rotation-transmitting mechanism to the arm mechanism.

The outer shaft is rotatable, arranged coaxially with the inner shaft on the outside of the inner shaft, and transmits a rotation movement of the output portion of the second rotation-transmitting mechanism to the arm mechanism.

In the conveying apparatus, the second rotation-transmitting mechanism may be arranged above the first rotation-transmitting mechanism coaxially with the first rotation-transmitting mechanism.

In this case, the second rotating body of the second rotation-transmitting mechanism may further include a top surface, a bottom surface, and a through-hole that passes through the top surface and the bottom surface.

Further, in this case, the inner shaft may be coupled to the arm mechanism and the output portion of the first rotation-transmitting mechanism via the through-hole of the second rotation-transmitting mechanism.

In the present invention, in the case where the arm mechanism is turned, the first rotation-transmitting mechanism and the second rotation-transmitting mechanism are rotated in the same direction at the same speed by the drive sources provided to the respective rotation-transmitting mechanisms. In the present invention, since the inner shaft passes through the through-hole of the second rotation-transmitting mechanism, spatial positions of the respective drive sources of the first rotation-transmitting mechanism and the second rotation-transmitting mechanism do not change even when the arm mechanism is turned. Accordingly, when the arm mechanism is turned, cables connected to the drive sources can be prevented from twining around the conveying apparatus. As a result, the arm mechanism can be turned by 360 degrees without any limitation.

In the conveying apparatus, the second rotation-transmitting mechanism may be arranged below the first rotation-transmitting mechanism coaxially with the first rotation-transmitting mechanism.

In this case, the second rotating body of the second rotation-transmitting mechanism may further include a top surface, a bottom surface, and a through-hole that passes through the top surface and the bottom surface.

The through-hole of the second rotation-transmitting mechanism is used as, for example, a hole for passing a cable connected to the drive source of the first rotation-transmitting mechanism therethrough. In the present invention, in the case where the arm mechanism is turned, the first rotation-transmitting mechanism is also rotated together with the arm mechanism by the rotation of the second rotation-transmitting mechanism. In this case, the drive source of the first rotation mechanism is also rotated. However, in the present invention, since the through-hole is used as a hole for passing a cable connected to the drive source of the first rotation-transmitting mechanism therethrough, it is unnecessary to coil the cable in advance, and displacement caused by repeatedly bending the cable does not occur. Further, it is also possible to prevent the cable from twining around the conveying apparatus.

According to an embodiment of the present invention, there is provided a driving apparatus including a rotation-transmitting mechanism and a driven unit.

The rotation-transmitting mechanism is a rotation-transmitting mechanism with a first stage and a second stage and includes a first rotating body, a second rotating body, a driving rotating body, and a plurality of planetary rotating bodies.

The first rotating body includes a first outer circumferential portion and a second outer circumferential portion.

The first outer circumferential portion is provided in the first stage.

The second outer circumferential portion is provided in the second stage.

The second rotating body includes a first inner circumferential portion and a second inner circumferential portion.

The first inner circumferential portion is opposed to the first outer circumferential portion in the first stage.

The second inner circumferential portion is opposed to the second outer circumferential portion in the second stage.

The driving rotating body is brought into contact with the first outer circumferential portion and the first inner circumferential portion in the first stage and rotated by a drive source.

The planetary rotating bodies are brought into contact with the second outer circumferential portion and the second inner circumferential portion in the second stage and revolve around the first rotating body.

The driven unit is driven by an output of the rotation-transmitting mechanism due to the revolution of the planetary rotating bodies.

Hereinafter, embodiments of the present invention will be described with reference to the drawings.

First Embodiment

Figure 1B:
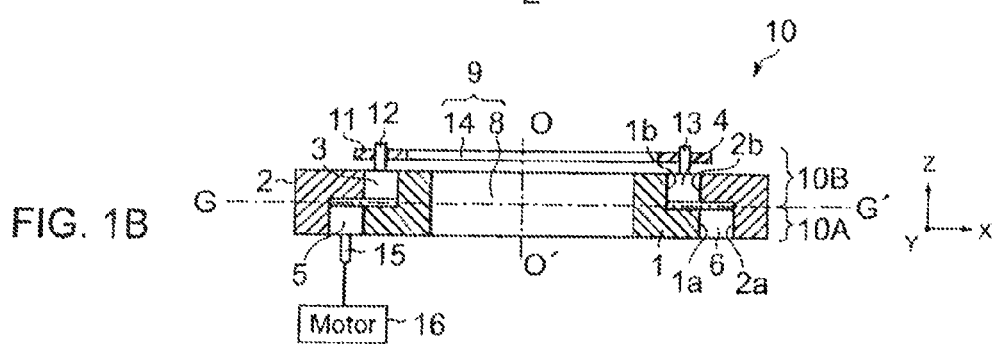
Figure 1C:
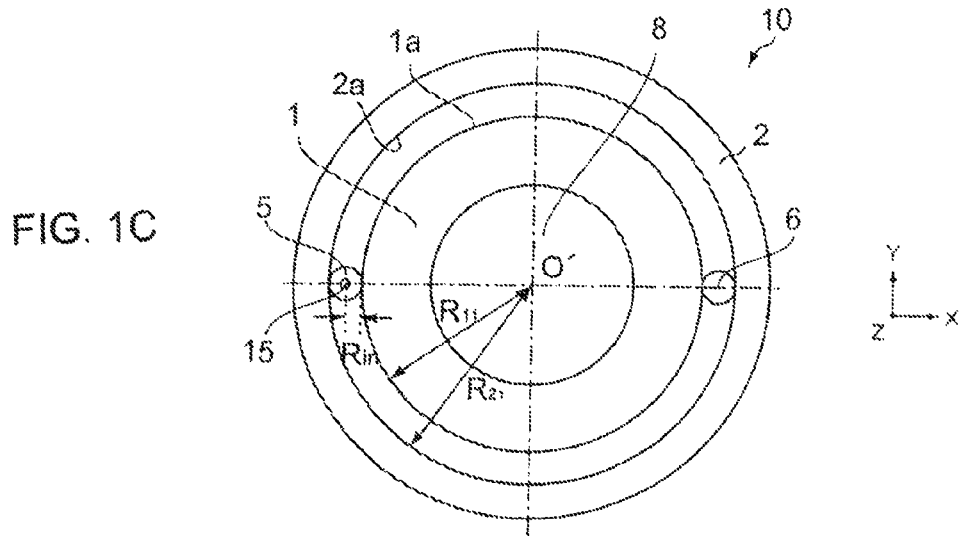

FIG. 1 are diagrams showing a rotation-transmitting mechanism according to a first embodiment of the present invention. FIG. 1(A) is a top view of the rotation-transmitting mechanism partially cut away, and FIG. 1(B) is a cross-sectional view taken along the line F-F' shown in FIG. 1(A), in which the rotation-transmitting mechanism is laterally viewed. FIG. 1(C) is a cross-sectional view taken along the line G-G' shown in FIG. 1(B), in which the rotation-transmitting mechanism is viewed from the above. In FIG. 1(A), the left part from the line E-E' of FIG. 1(A) is shown without an output plate.

As shown in those figures, a rotation-transmitting mechanism 10 is a 2-stage rotation-transmitting mechanism and is formed by an input side (lower stage) 10A (see FIG. 1(C)) and an output side (upper stage) 10B (see FIG. 1(A)). In the rotation-transmitting mechanism 10, a hollow portion 9 is formed at the center of the rotation-transmitting mechanism 10 along the axis O-O'.

The rotation-transmitting mechanism 10 includes an inner rotating body (first rotating body) 1 forming the inside of the rotation-transmitting mechanism 10 and an outer rotating body (second rotating body) 2 forming the outside of the rotation-transmitting mechanism 10. The rotation-transmitting mechanism 10 includes a first planetary rotating body 3, a second planetary rotating body 4, a driving rotating body 5, and a rotating body 6, which are arranged between the inner rotating body 1 and the outer rotating body 2 and brought into contact with those rotating bodies 1 and 2. The rotation-transmitting mechanism 10 includes an output plate 11 for outputting the revolution of the planetary rotating bodies 3 and 4.

The inner rotating body 1 is rotatable about the axis O-O'. The inner rotating body 1 is formed such that a diameter on the input side 10A is different from that on the output side 10B. In the inner rotating body 1, a through-hole 8 is formed so as to pass through the center of the top surface and bottom surface. The inner rotating body 1 has a first outer circumferential surface 1a on the input side 10A (lower stage) and a second outer circumferential surface 1b on the output side 10B (upper stage). In the following description, an outer radius of the inner rotating body 1 on the input side is denoted by $R_{11}$ and an outer radius of the inner rotating body 1 on the output side 10B is denoted by $R_{12}$.

The outer rotating body 2 is arranged coaxially with the inner rotating body 1 and is rotatable about the axis O-O' similar to the inner rotating body 1. Similar to the inner rotating body 1, the outer rotating body 2 is also formed such that a diameter on the input side 10A is different from that on the output side 10B. The outer rotating body 2 has a first inner circumferential surface 2a opposed to the first outer circumferential surface 1a of the inner rotating body 1 on the input side 10A (lower stage) and a second inner circumferential surface 2b opposed to the second outer circumferential surface 1b of the inner rotating body 1 on the output side 10B (upper stage). In the following description, an inner radius of the outer rotating body 2 on the input side 10A is denoted by $R_{21}$ and an inner radius of the outer rotating body 2 on the output side 10B is denoted by $R_{22}$.

The driving rotating body 5 has a cylindrical shape and is arranged on the input side 10A and brought into contact with the outer circumferential surface 1a of the inner rotating body 1 and the inner circumferential surface 2a of the outer rotating body 2. The driving rotating body 5 is connected to a motor 16 via an output axis 15 of the motor. Hereinafter, description will be made with a radius of the driving rotating body 5 denoted by $R_{in}$.

On the input side 10A of the rotation-transmitting mechanism 10, the rotating body 6 is arranged at a position opposed to the driving rotating body 5 with the inner rotating body 1 interposed therebetween. The rotating body 6 has a cylindrical shape and substantially the same radius as the radius $R_{in}$ of the driving rotating body. Unlike the driving rotating body 5, the rotating body 6 is not typically connected to a motor. However, without being limited thereto, the rotating body 6 may be connected to a motor. In this case, the rotating body 6 is rotated in synchronization with the rotation of the driving rotating body 5 by the motor.

The first planetary rotating body 3 and the second planetary rotating body 4 each have a cylindrical shape. The first planetary rotating body 3 and the second planetary rotating body 4 are arranged on the output side 10B and brought into contact with the second outer circumferential surface 1b of the inner rotating body 1 and the second inner circumferential surface 2b of the outer rotating body 2. The first planetary rotating body 3 and the second planetary rotating body 4 are arranged at positions opposed to each other with the inner rotating body 1 interposed therebetween. The first planetary rotating body 3 and the second planetary rotating body 4 are provided with a support axis 12 and a support axis 13, respectively. In the following description, the radius of the first planetary rotating body 3 and second planetary rotating body 4 is denoted by $R_3$.

The output plate 11 is supported by the support axis 12 and the support axis 13 and is rotatable about the axis O-O'. The output plate 11 is provided with an opening 14 at the center. The opening 14 and the through-hole 8 described above form the hollow portion 9 of the rotation-transmitting mechanism.

It should be noted that the hollow portion 9 provided at the center of the rotation-transmitting mechanism 10 can be used in a variety of applications, and is used as, for example, a hole for passing wiring such as cables, a pipe for cold water, or the like there through.

Description on Operation

Next, an operation of the rotation-transmitting mechanism 10 will be described.

Figure 2A:
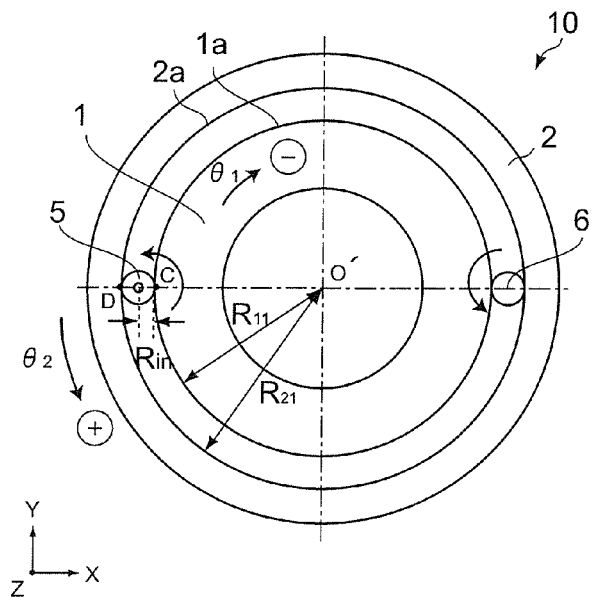
FIGS. 2A and 2B are diagrams for explaining an operation of the rotation-transmitting mechanism according to the embodiment of the present invention.
Figure 2B:
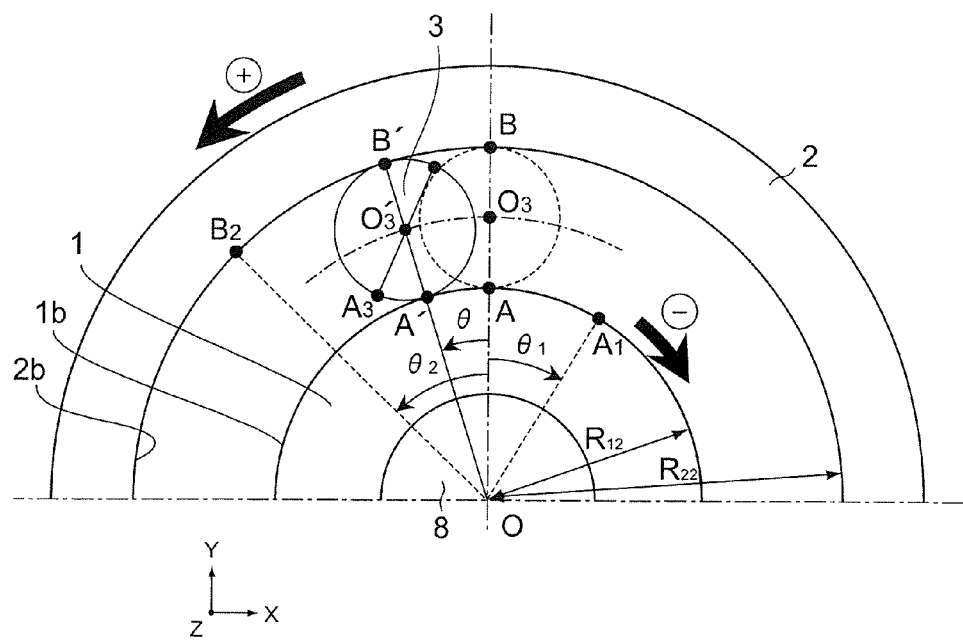

FIG. 2 are diagrams for explaining an operation of the rotation-transmitting mechanism 10. FIG. 2(A) is a diagram for explaining an operation on the input side 10A (lower stage), and FIG. 2(B) is a diagram for explaining an operation on the output side (upper stage).

First, with reference to FIG. 2(A), an operation on the input side will be described.

As shown in FIG. 2(A), when the driving rotating body 5 is rotated counterclockwise by the motor 16, the inner rotating body 1 brought into contact with the driving rotating body 5 on the first outer circumferential surface 1a is rotated clockwise about the axis O-O' (inverse rotation). On the other hand, the outer rotating body 2 brought into contact with the driving rotating body 5 on the first inner circumferential surface 2a is rotated counterclockwise about the axis O-O' (positive rotation). At this time, the rotating body 6 arranged at the position opposed to the driving rotating body 5 is rotated counterclockwise at a fixed position by the rotation of the outer rotating body 2 and the inner rotating body 1.

Here, a case where the driving rotating body 5 is rotated 360 degrees counterclockwise will be considered.

When the driving rotating body 5 is rotated 360 degrees counterclockwise, a contact C between the driving rotating body 5 and the outer circumferential surface 1a of the inner rotating body 1 is moved by $2\pi R_{in}$ along the first outer circumferential surface 1a. Since the outer radius of the inner rotating body 1 on the input side 10A is $R_{11}$, the inner rotating body 1 is rotated clockwise by an angle $\theta_1$ shown in the following expression (1).

$$\theta_1 = 2\pi R_{in}/R_{11} \quad (1)$$

Similarly, when the driving rotating body 5 is rotated 360 degrees counterclockwise, a contact D between the driving rotating body 5 and the outer circumferential surface 1a of the outer rotating body 2 is moved by $2\pi R_{in}$ along the first inner circumferential surface 2a. Since the outer radius of the outer rotating body 2 on the input side 10A is $R_{21}$, the outer rotating body 2 is rotated counterclockwise by an angle $\theta_2$ shown in the following expression (2).

$$\theta_2 = 2\pi R_{in}/R_{21} \quad (2)$$

Next, with reference to FIG. 2(B), an operation on the output side 10B will be described.

As shown in FIG. 2(B), when the inner rotating body 1 is rotated clockwise on the input side 10A, the inner rotating body 1 is also rotated clockwise on the output side 10B (inverse rotation). Similarly, when the outer rotating body 2 is rotated counterclockwise on the input side 10A, the outer rotating body 2 is also rotated counterclockwise on the output side 10B (positive rotation).

By the clockwise rotation of the inner rotating body 1 (inverse rotation) and the counterclockwise rotation of the outer rotating body 2 (positive rotation), the rotation and revolution of the planetary rotating bodies 3 and 4 arranged between the second outer circumferential surface 1b and the second inner circumferential surface 2b are started. In this case, a slight difference is generated between absolute rotation speeds of the second inner circumferential surface 2b and the second outer circumferential surface 1b, with the result that the planetary rotating bodies 3 and 4 can be revolved very slowly around the inner rotating body 1.

Here, a case where the driving rotating body 5 is rotated 360 degrees counterclockwise will be considered.

When the driving rotating body 5 is rotated 360 degrees counterclockwise, the inner rotating body 1 is rotated clockwise by the angle $\theta_1$ on the input side 10A, and therefore the inner rotating body 1 is also rotated clockwise by the angle $\theta_1$ on the output side 10B. Similarly, when the driving rotating body 5 is rotated 360 degrees counterclockwise, the outer rotating body 2 is rotated counterclockwise by the angle $\theta_2$ on the input side 10A, and therefore the outer rotating body 2 is also rotated counterclockwise by the angle $\theta_2$ on the output side 10B.

When the inner rotating body 1 is rotated clockwise by $\theta_1$, a contact A between the second outer circumferential surface 1b of the inner rotating body 1 and the first planetary rotating body 3 is moved to a position A1 shown in FIG. 2(B). Since the outer radius of the inner rotating body 1 on the output side 10B is $R_{12}$, an arc $AA_1$ is represented by the following expression (3).

$$AA_1 = R_{12} \cdot \theta_1 \quad (3)$$

Similarly, when the outer rotating body 2 is rotated counterclockwise by $\theta_2$, a contact B between the second inner circumferential surface 2b of the outer rotating body 2 and the first planetary rotating body 3 is moved to a position B2. Since the inner radius of the outer rotating body on the output side 10B is $R_{22}$, an arc $BB_2$ is represented by the following expression (4).

$$BB_2 = R_{22} \cdot \theta_2 \quad (4)$$

At this time, it is assumed that the center $O_3$ of the first planetary rotating body 3 rotates about the point O counterclockwise by an angle $\theta$ and then the center $O_3$ is moved to $O_3'$. Further, it is assumed that a contact between the first planetary rotating body 3 and the second outer circumferential surface 1b of the inner rotating body 1 at this time is denoted by A', and a contact between the first planetary rotating body 3 and the second inner circumferential surface 2b of the outer rotating body 2 is denoted by B'.

In this case, an arc $A'A_1$ (relative moving distance of the contact between the first planetary rotating body 3 and the inner rotating body 1) is represented by the following expression (5), and an arc $B'B_2$ (relative moving distance of the contact between the first planetary rotating body 3 and the outer rotating body 2) is represent by the following expression (6).

$$A'A_1 = R_{12} \cdot \theta_1 + R_{12} \cdot \theta \quad (5)$$

$$B'B_2 = R_{22} \cdot \theta_2 - R_{22} \cdot \theta \quad (6)$$

Here, in order that the first planetary rotating body 3 rotates between the inner rotating body 1 and the outer rotating body 2 without sliding, the following condition, arc $A'A_1$=arc $B'B_2$, is necessary and therefore the following expression (7) is established.

$$R_{12} \cdot \theta_1 + R_{12} \cdot \theta = R_{22} \cdot \theta_2 - R_{22} \cdot \theta \qquad (7)$$

When the expression (7) above is organized for θ, θ is represented by the following expression (8).

$$\theta = (R_{22} \cdot \theta_2 - R_{12} \cdot \theta_1)/(R_{22} + R_{12}) \qquad (8)$$

When the expressions (1) and (2) are substituted into the expression (8), the angle θ is represented by the following expression (9).

$$\theta = 2\pi R_{in}(R_{22}/R_{21} - R_{12}/R_{11})/(R_{22} + R_{12}) \qquad (9)$$

Specifically, when the driving rotating body 5 is rotated 360 degrees counterclockwise, the center $O_3$ of the first planetary rotating body is rotated counterclockwise about the point O by the angle θ indicated by the expression (9). In this case, the first planetary rotating body 3 revolves around the inner rotating body 1 by the angle θ along the second outer circumferential surface 1b of the inner rotating body 1. It should be noted that the second planetary rotating body 4, which is arranged at the position opposed to the first planetary rotating body, also revolves around the inner rotating body 1 by the angle θ along the second outer circumferential surface 1b of the inner rotating body 1, as in the case of the first planetary rotating body.

As described above, the first planetary rotating body 3 and the second planetary rotating body 4 are provided with the support axis 12 and the support axis 13, respectively. The support axes 12 and 13 support the output plate 11 so that the output plate 11 can be rotated. Therefore, when the driving rotating body 5 is rotated 360 degrees counterclockwise, the output plate 11 is rotated counterclockwise by the angle θ about the axis O-O'.

From the above, the deceleration ratio of the rotation-transmitting mechanism 10 according to this embodiment is represented by the following expression (10).

$$\text{(Deceleration ratio)} = \theta/2\pi = R_{in}(R_{22}/R_{21} - R_{12}/R_{11})/(R_{22} + R_{12}) \qquad (10).$$

FIG. 3 is a table showing an example of a radius (inner diameter or outer diameter) of each of the rotating bodies 1 to 5.

In the example shown in FIG. 3, the radius $R_{in}$ of the driving rotating body 5 is set to 5 mm ($R_{in}$=5 mm), the outer radius $R_{11}$ of the inner rotating body 1 on the input side 10A is set to 50 mm ($R_{11}$=50 mm), and the outer radius $R_{12}$ of the inner rotating body 1 on the output side 10B is set to 40 mm ($R_{12}$=40 mm). Further, the inner radius $R_{21}$ of the outer rotating body 2 on the input side 10A is set to 60 mm ($R_{21}$=60 mm), the inner radius $R_{22}$ of the outer rotating body 2 on the output side 10B is set to 50 mm ($R_{22}$=50 mm), and the radius $R_3$ of the first planetary rotating body 3 and second planetary rotating body 4 is set to 5 mm ($R_3$=5 mm).

In this case, the deceleration ratio of the rotation-transmitting mechanism 10 is 1/540. It should be noted that the outer radius of the inner rotating body 1, the inner radius of the outer rotating body, and the like can take other values as a matter of course.

As described above, in the rotation-transmitting mechanism 10 according to this embodiment, a high deceleration ratio of 1/100 or more can be easily achieved. Further, in the rotation-transmitting mechanism 10, a high deceleration ratio can be obtained in two stages, and therefore the downsizing and thinning of the rotation-transmitting mechanism 10 can also be easily achieved.

In addition, the rotation axis of the driving rotating body 5, that is, the input axis is offset from the center axis (axis O-O') of the rotation-transmitting mechanism 10. Accordingly, the hollow portion 9 can be formed at the center of the rotation-transmitting mechanism 10 and used in various applications. The hollow portion 9 is used as, for example, a hole for passing wiring such as cables, a pipe for cold water, or the like therethrough, as described above.

Second Embodiment

Next, a rotation-transmitting mechanism according to a second embodiment of the present invention will be described. It should be noted that in the description of the second embodiment, members having the same structures and functions as those of the first embodiment described above will be denoted by the same reference symbols, and description thereof will be omitted or simplified.

Figure 4A:
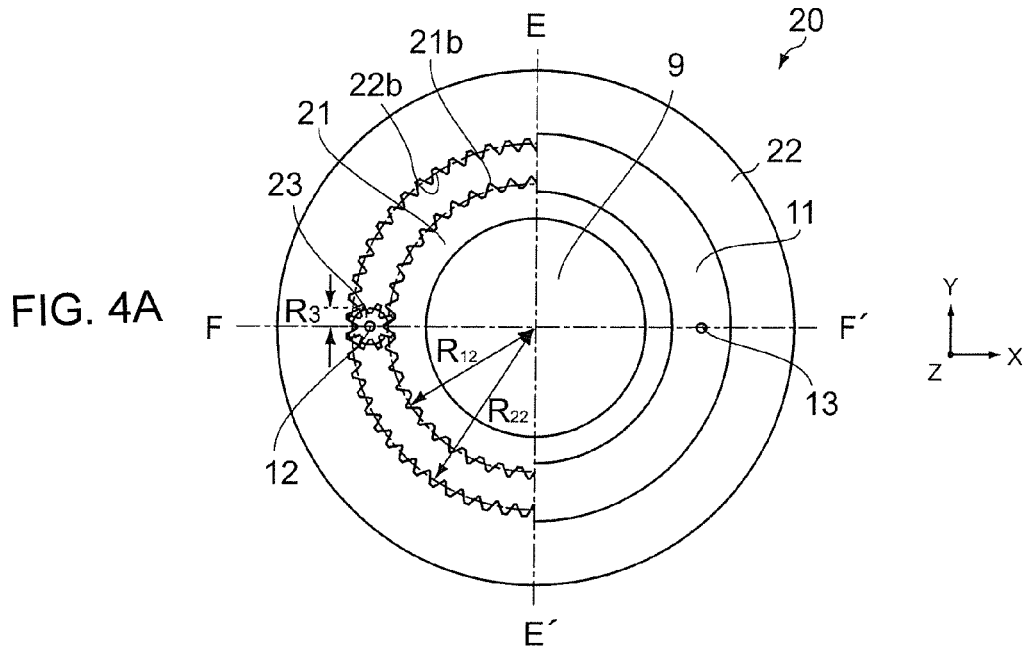
FIGS. 4A-4C are diagrams showing a rotation-transmitting mechanism according to another embodiment.
Figure 4B:
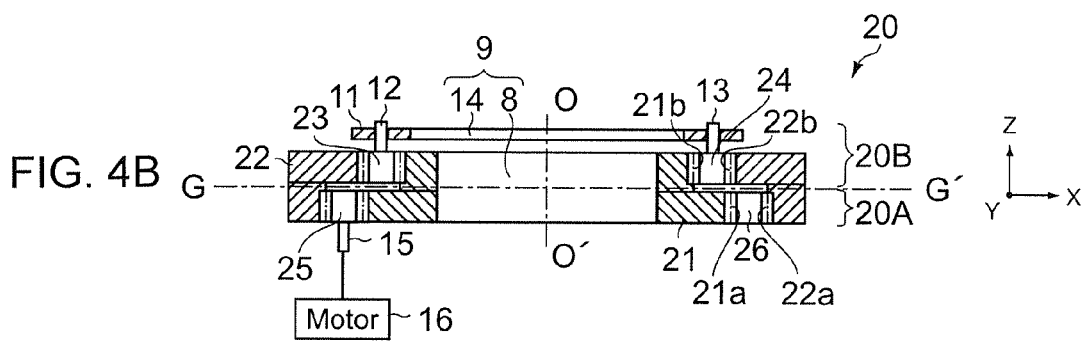
Figure 4C:
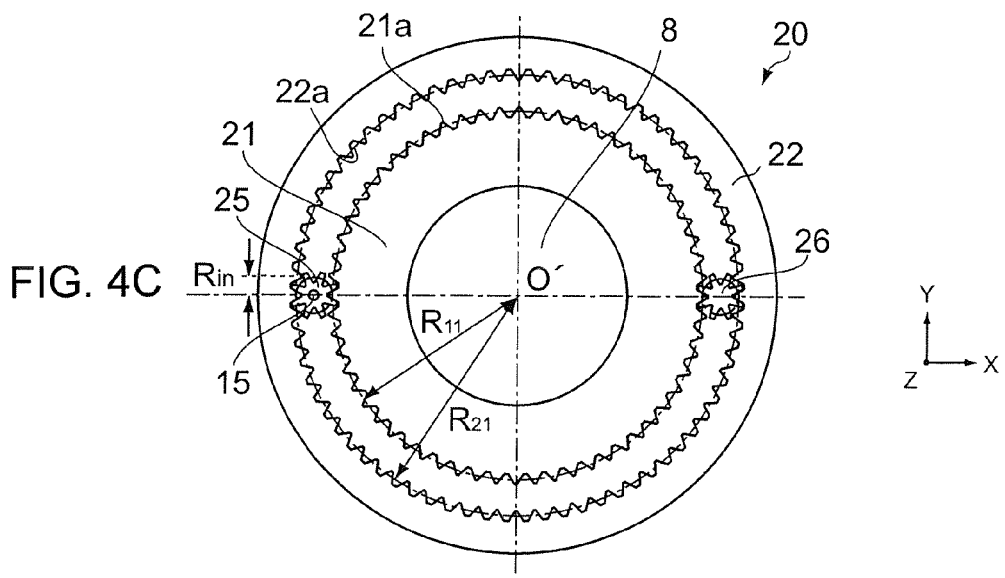

FIG. 4 are diagrams showing a rotation-transmitting mechanism according to the second embodiment. FIG. 4(A) is a top view of the rotation-transmitting mechanism partially cut away. FIG. 4(B) is a cross-sectional view taken along the line F-F' shown in FIG. 4(A), in which the rotation-transmitting mechanism is laterally viewed. FIG. 4(C) is a cross-sectional view taken long the line G-G' shown in FIG. 4(B), in which the rotation-transmitting mechanism is viewed from the above. In FIG. 4(A), the left part from the line E-E' of FIG. 4(A) is shown without an output plate.

The second embodiment is different from the first embodiment in that the rotating bodies 1 to 6 described in the first embodiment above are formed of gears (toothed wheels) in the second embodiment, and therefore the difference will mainly be described.

As shown in FIG. 4, a rotation-transmitting mechanism 20 includes a sun gear 21 and a ring gear 22. The sun gear 21 is arranged inside the rotation-transmitting mechanism 20 and is rotatable about the axis O-O'. The ring gear 22 is arranged coaxially with the sun gear 21 and is rotatable outside the sun gear 21. On an input side 20A (lower stage) of the rotation-transmitting mechanism 20, a driving gear 25 connected to a motor and a gear 26 provided at a position opposed to the driving gear 25 are arranged. Further, on an output side 20B (upper stage) of the rotation-transmitting mechanism 20, a first planetary gear 23 and a second planetary gear 24 that revolve around the sun gear 21 while rotating are arranged.

The sun gear 21 corresponds to the inner rotating body 1 described in the first embodiment, the ring gear 22 corresponds to the outer rotating body 2, and the first planetary gear 23 and the second planetary gear 24 correspond to the first planetary rotating body 3 and the second planetary rotating body 4, respectively. Further, the driving gear 25 corresponds to the driving rotating body 5, and the gear 26 corresponds to the rotating body 6.

In the description of the second embodiment, a pitch circle radius (outer diameter) of the sun gear 21 on the input side 20A is denoted by $R_{11}$, and a pitch circle radius (outer diameter) of the sun gear 21 on the output side 20B is denoted by $R_{12}$. Similarly, a pitch circle radius (inner diameter) of the ring gear 22 on the input side 20A is denoted by $R_{21}$, and a pitch circle radius (inner diameter) of the ring gear 22 on the output side 20B is denoted by $R_{22}$. Further, a pitch circle radius of the driving gear 25 is denoted by $R_{in}$, and a pitch circle radius of the first planetary gear 23 and second planetary gear 24 is denoted by $R_3$.

FIG. 5 is a table showing an example of a combination of the pitch circle radius and the number of teeth in each of the gears 21 to 26. It should be noted that in the example shown in FIG. 5, a module m (m=pitch circle diameter/number of teeth N) is set to 0.5.

Here, in the case where the module m is 0.5, a relationship between a pitch circle radius R ($R_{11}$, $R_{12}$, $R_{21}$, $R_{22}$, $R_{in}$, $R_3$) of each of the gears 21 to 26 and the number of teeth N ($N_{11}$, $N_{12}$, $N_{21}$, $N_{22}$, $N_{in}$, $N_3$) of each of the gears 21 to 26 is represented by the following expression (11).

$$R=1/4N(R_{11}=1/4N_{11}, R_{12}=1/4N_{12}, R_{21}=1/4N_{21}, R_{22}=1/4N_{22}, R_{in}=1/4N_{in}, R_3=1/4N_3) \quad (11).$$

When the expression (11) is substituted into the expression (10) above, the deceleration ratio is represented by the following expression (12).

$$\text{(Deceleration ratio)}=N_{in}(N_{22}/N_{21}-N_{12}/N_{11})/(N_{22}+N_{12}) \quad (12).$$

When the number of teeth N of each of the gears 21 to 26 shown in FIG. 4 is substituted into the expression (12), the deceleration ratio can be obtained. It is found that the deceleration ratio is 1/540 in the example shown in FIG. 5.

Hereinabove, though the second embodiment has simply been described, the basic operation or the effect to be produced are the same as those of the first embodiment described above, and therefore description thereof will be omitted.

First Embodiment of Conveying Apparatus

Next, a conveying apparatus equipped with a rotation-transmitting mechanism will be described as an example of a utilization form of a rotation-transmitting mechanism.

Figure 6:
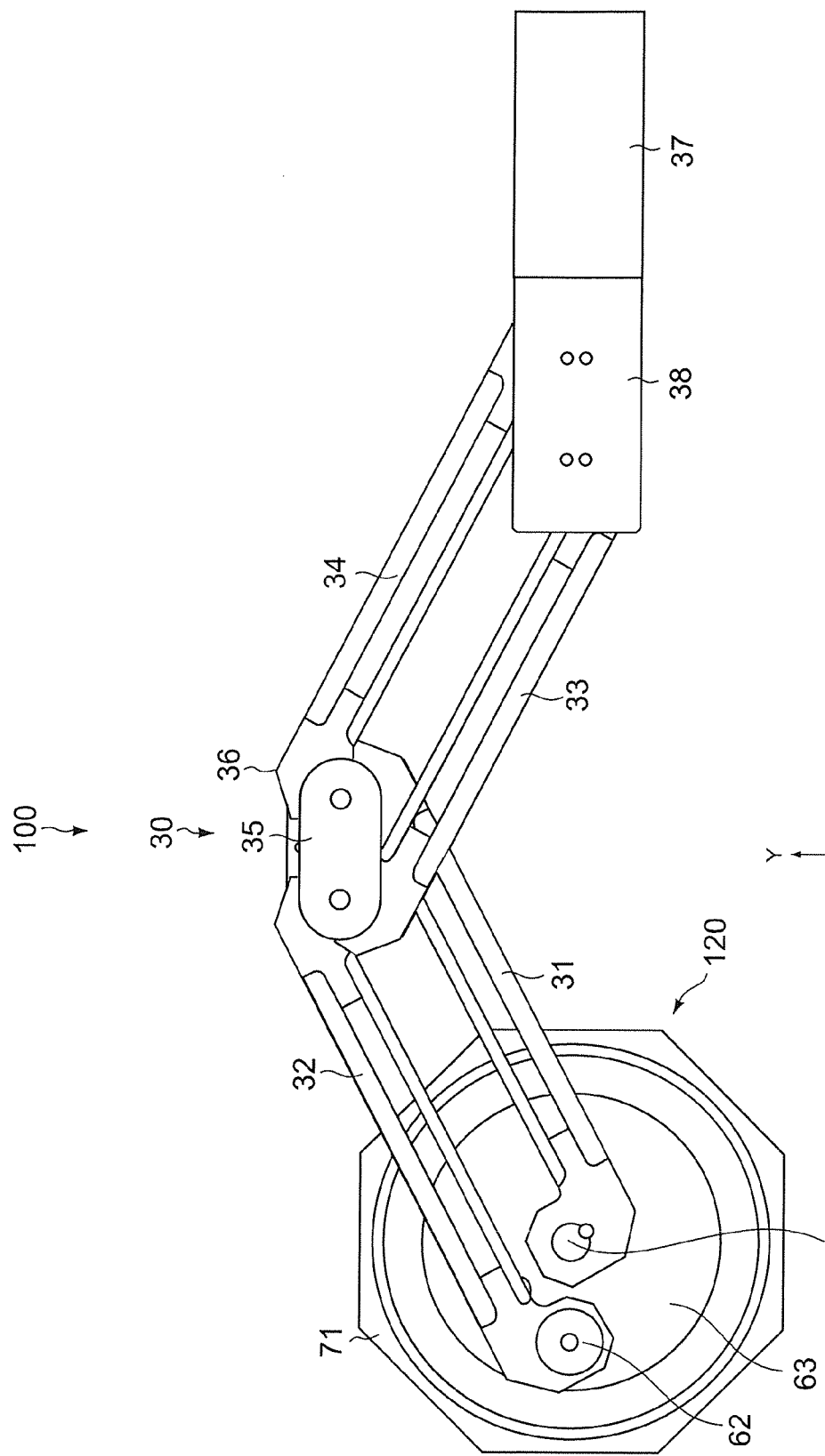
FIG. 6 is a top view of a conveying apparatus according to an embodiment of the present invention.
Figure 7:
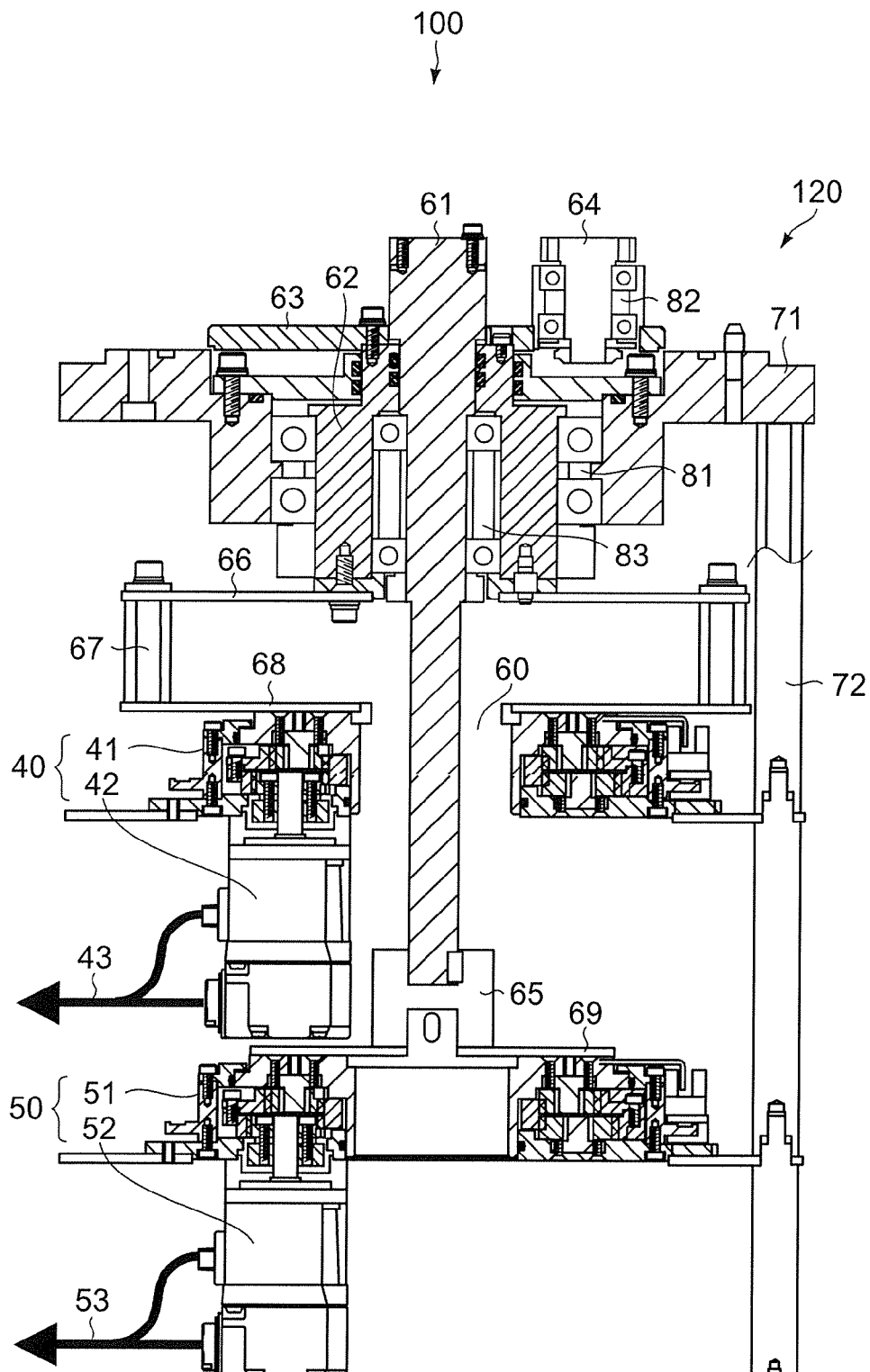
FIG. 7 is a cross-sectional view of the conveying apparatus according to the embodiment of the present invention, in which the conveying apparatus is laterally viewed.

FIG. 6 is a top view of a conveying apparatus according to this embodiment, and FIG. 7 is a cross-sectional view of the conveying apparatus, in which the conveying apparatus is laterally viewed. It should be noted that in FIG. 7, the illustration of an arm mechanism is omitted.

As shown in those figures, a conveying apparatus 100 according to this embodiment includes an arm mechanism 30 and a base portion 120 for driving the arm mechanism 30.

The base portion 120 includes an upper driving mechanism 40 for extending and retracting and turning the arm mechanism 30, and a lower driving mechanism 50. The upper driving mechanism 40 includes an upper rotation-transmitting mechanism 41 and an upper motor 42 for driving the upper rotation-transmitting mechanism 41. The lower driving mechanism 50 includes a lower rotation-transmitting mechanism 51 and a lower motor 52 for driving the lower rotation-transmitting mechanism 51.

Further, the base portion 120 includes a rotatable inner shaft 61 that transmits the rotation of the lower rotation-transmitting mechanism 51 to the arm mechanism 30, and an outer shaft 62 that is rotatable outside the inner shaft 61 and transmits the rotation of the upper rotation-transmitting mechanism 41 to the arm mechanism 30.

In addition, the base portion 120 includes a turntable 63 that is coupled to the outer shaft 62 and supports the arm mechanism 30 so as to be turnable, a flange portion 71 that supports the outer shaft 62 via a ball bearing 81, and a support column 72 that supports the flange portion 71, the upper driving mechanism 40, and the lower driving mechanism 50.

The arm mechanism 30 includes a parallel link mechanism 36, a placing-table attaching base 38 provided at the leading end of the parallel link mechanism 36, and a placing table 37 attached to the placing-table attaching base 38. The parallel link mechanism 36 is constituted of a first link bar 31 to a fourth link bar 34 and a fifth link bar 35 shorter than those link bars.

An end of the first link bar 31 is coupled to the inner shaft 61 protruding from the center of the turntable 63, and the other end of the first link bar 31 is coupled to an end of the fourth link bar 34 via the fifth link bar 35. An end of the second link bar 32 is coupled to a driven shaft 64 rotatably attached to the turntable 63 via a ball bearing 82. The other end of the second link bar 32 is coupled to the third link bar 33 via the fifth link bar 35.

At the leading ends of the third link bar 33 and fourth link bar 34, the placing-table attaching base 38 is provided. To the placing-table attaching base 38, the placing table 37 for placing an object to be conveyed (not shown) is attached. In this embodiment, an object to be conveyed is typically a semiconductor wafer substrate, such as a glass substrate used for a display, for example.

The outer shaft 62 and the turntable 63 are fixed, and the arm mechanism 30 can be turned together with the turntable 63 by the rotation of the shaft 62. Further, the arm mechanism 30 can be extended and retracted (bent) by the rotation of the inner shaft 61. The placing table 37 is linearly movable in a centrifugal direction of the turntable 63 by the extension and retraction (bending) of the parallel link mechanism 36.

The upper rotation-transmitting mechanism 41 and the lower rotation-transmitting mechanism 51 are arranged coaxially. The upper rotation-transmitting mechanism 41 is arranged above the lower rotation-transmitting mechanism 51 (the lower rotation-transmitting mechanism 51 is arranged below the upper rotation-transmitting mechanism 41). The upper motor 42 and the lower motor 52 are respectively provided with a cable 43 and a cable 53 used for power supply or the like.

The upper driving mechanism 40 and the lower driving mechanism 50 are fixed to the support column 72, to thereby be fixed at predetermined positions inside the base portion 120.

The inner shaft 61 is rotatably supported by the outer shaft 62 via a ball bearing 83. An upper end of the inner shaft 61 protrudes from the turntable 63 and is coupled to the first link bar 31 of the arm mechanism 30. A lower end of the inner shaft 61 is coupled to an output plate 69 of the lower rotation-transmitting mechanism 51 via a coupling 65. The inner shaft 61 couples the arm mechanism 30 and the lower rotation-transmitting mechanism 51 via a hollow portion 60 (see FIG. 8) provided to the upper rotation-transmitting mechanism 41. In other words, the hollow portion 60 of the upper rotation-transmitting mechanism 41 is used as a hole for passing the inner shaft 61 therethrough.

An upper portion of the outer shaft 62 is fixed to the turntable 63 as described above, and a lower portion of the outer shaft 62 is coupled to a turn plate 66. The turn plate 66 is a disc-like member having an opening at the center and is coupled to an output plate 68 of the upper rotation-transmitting mechanism 41 via a support column 67.

Figure 8:
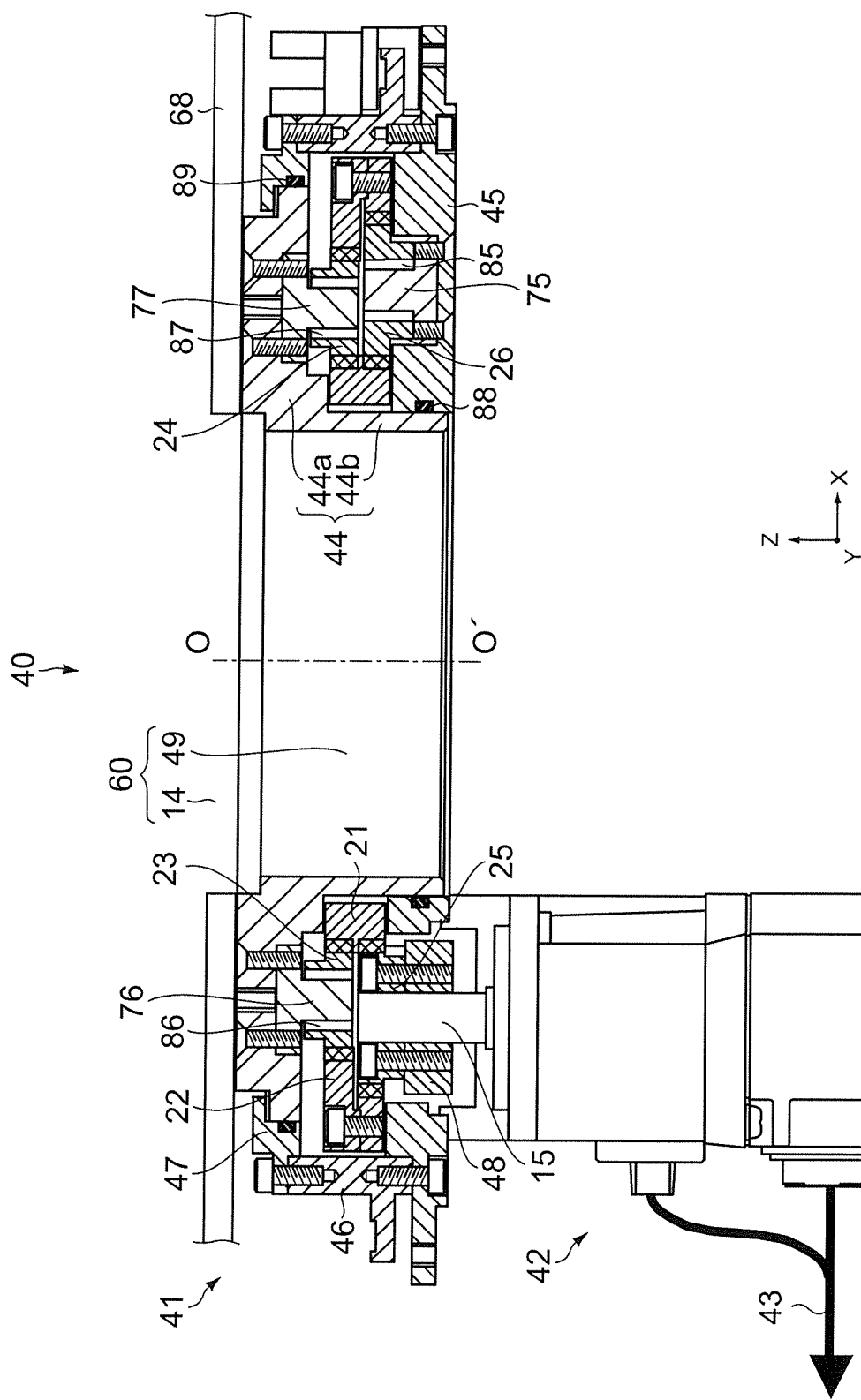
FIG. 8 is a cross-sectional view of an upper driving mechanism, in which the upper driving mechanism is laterally viewed.

FIG. 8 is a cross-sectional view of the upper driving mechanism 40, in which the upper driving mechanism 40 is laterally viewed. It should be noted that in the description of FIG. 8, members having the same functions and structures as the rotation-transmitting mechanism 20 (rotation-transmitting mechanism formed of gears) according to the second embodiment described above will be denoted by the same reference symbols, and differences will mainly be described.

The upper rotation-transmitting mechanism 41 includes the sun gear 21, the ring gear 22, the first planetary gear 23, the second planetary gear 24, the driving gear 25, the gear 26, and the output plate 68. The upper rotation-transmitting mechanism 41 further includes a rotatable output axis 44 interposed between the first planetary gear 23 and second planetary gear 24 and the output plate 68.

Further, the upper rotation-transmitting mechanism 41 includes a base member 45 serving as a base of the upper rotation-transmitting mechanism 41, a sidewall member 46 that is fixed to the base member 45 and forms a side circumferential portion of the upper rotation-transmitting mechanism 41, and a holding plate 47 that is fixed to the sidewall member 46 and holds the output axis 44 from the above.

The sun gear 21 is rotatable about the axis O-O', and the center thereof is hollow. The sun gear 21 is engaged with the driving gear 25 and the gear 26 at the outer circumferential portion on the input side 20A (lower stage), and engaged with the first planetary gear 23 and the second planetary gear 24 on the output side 20B (upper stage).

The ring gear 22 is arranged coaxially with the sun gear 21. At the inner circumferential portion, the ring gear 22 is engaged with the driving gear 25 and the gear 26 on the input side 20A and with the first planetary gear 23 and the second planetary gear 24 on the output side 20B.

The driving gear 25 arranged on the input side 20A is fixed to the output axis 15 of the upper motor 42 via a coupling portion 48, and inputs a rotation movement of the upper motor 42 to the upper rotation-transmitting mechanism 41. The upper motor 42 is fixed to the base member 45 of the upper rotation-transmitting mechanism 41. On the input side 20A of the upper rotation-transmitting mechanism 41, the gear 26 arranged at the position opposed to the driving gear 25 with the sun gear 21 interposed therebetween is rotatably supported, via a needle bearing 85, by an axis 75 fixed to the base member 45.

The first planetary gear 23 and the second planetary gear 24 that are arranged on the output side 20B of the upper rotation-transmitting mechanism 41 and revolve around the sun gear 21 are rotatably supported by an axis 76 and an axis 77 via a needle bearing 86 and a needle bearing 87, respectively.

The axis 76 and the axis 77 that rotatably support the first planetary gear 23 and the second planetary gear 24, respectively, are fixed to the output axis 44. Accordingly, the output axis 44 can be rotated about the axis O-O' when the first planetary gear 23 and the second planetary gear 24 revolve around the sun gear 21.

The output axis 44 is provided with a through-hole 49 so as to pass through the top and bottom surfaces at the center along the axis O-O'. The output axis 44 is formed such that an upper portion 44a of the output axis 44 has an outer diameter larger than that of a lower portion 44b of the output axis.

A first O-ring 88 is provided between an outer circumferential surface of the lower portion 44b of the output axis and the base member 45. A second O-ring 89 is provided between an outer circumferential surface of the upper portion 44a of the output axis and the holding plate 47. With those two O-rings 88 and 89, a space surrounded by the output axis 44, the base member 45, the sidewall member 46, and the holding plate 47 is sealed. Into the sealed space, a lubricant such as grease or oil is injected.

Accordingly, the rotation movements of the gears 21 to 26 can be made smooth, and the rotation movement of the output axis 44 with respect to the base member 45 or the holding plate 47 can also be made smooth. It should be noted that when the conveying apparatus 100 is used in a vacuum, a vacuum grease (for example, YVAC1 manufactured by Solvay Solexis) may be used as a lubricant.

The output plate 68 is fixed to the output axis 44 at the upper portion of the output axis 44 and is rotatable about the axis O-O' together with the output axis 44 by the revolution of the first planetary gear 23 and the second planetary gear 24.

The output plate 68 is provided with an opening 14 at the center. The opening 14 and the through-hole 49 of the output axis 44 form the hollow portion 60 of the upper rotation-transmitting mechanism.

It should be noted that the structure of the lower rotation-transmitting mechanism 51 is the same as that of the upper rotation-transmitting mechanism 41, and therefore detailed description thereof will be omitted. Regarding the lower rotation-transmitting mechanism 51, members having the same functions and structures as those of the upper rotation-transmitting mechanism 41 will be denoted by the same reference symbols.

Description on Operation

Next, an operation of the conveying apparatus 100 will be described.

First, an operation when the arm mechanism 30 is extended and retracted (bent) by the drive of the lower driving mechanism 50 will be described.

When the lower motor 52 is driven, the driving gear 25 fixed to the output axis 15 of the motor is rotated counterclockwise as viewed from the above, for example. When the driving gear 25 is rotated counterclockwise, the sun gear 21 engaged with the driving gear 25 is rotated clockwise, and the ring gear 22 is rotated counterclockwise. On the input side 20A, when the sun gear 21 and the ring gear 22 are rotated, the gear 26 engaged with the sun gear 21 and the ring gear 22 is rotated counterclockwise at a fixed position.

On the other hand, on the output side 20B, when the sun gear 21 and the ring gear 22 are rotated, the first planetary gear 23 and the second planetary gear 24 engaged with those gears 21 and 22 revolve counterclockwise around the sun gear 21 while rotating. When the first planetary gear 23 and the second planetary gear 24 revolve counterclockwise around the sun gear 21, the output axis 44 coupled to the two planetary rotating bodies 23 and 24 are rotated counterclockwise via the needle bearings 86 and 87 and the axes 76 and 77. By the counterclockwise rotation of the output axis 44, the output plate 69 and the inner shaft 61 are rotated counterclockwise, and the arm mechanism 30 is extended and retracted. In this case, the placing table 37 of the arm mechanism 30 is linearly moved in a centrifugal direction of the turntable 63 by the extension and retraction of the parallel link mechanism 36.

Next, an operation when the arm mechanism 30 is turned by the drive of the upper driving mechanism 40 will be described.

When the upper motor 42 is driven, the driving gear 25, the sun gear 21, the ring gear 22, the gear 26, the first planetary gear 23, the second planetary gear 24, and the output axis 44 are rotated. When the output axis 44 is rotated, the output plate 68, the support column 67, the turn plate 66, the outer shaft 62, and the turntable 63 are rotated, and the arm mechanism 30 is turned. It should be noted that when only the outer shaft 62 is rotated with the inner shaft 61 fixed, the arm mechanism 30 is extended and retracted while being turned. Accordingly, to prevent the arm mechanism 30 from being extended and retracted, the inner shaft 61 is also rotated in the same direction at the same speed as the outer shaft 62 by the lower driving mechanism 50.

Next, taking a conveying apparatus 300 according to Comparative Example as an example, a problem of twining of a cable connected to a motor will be described.

Figure 9:
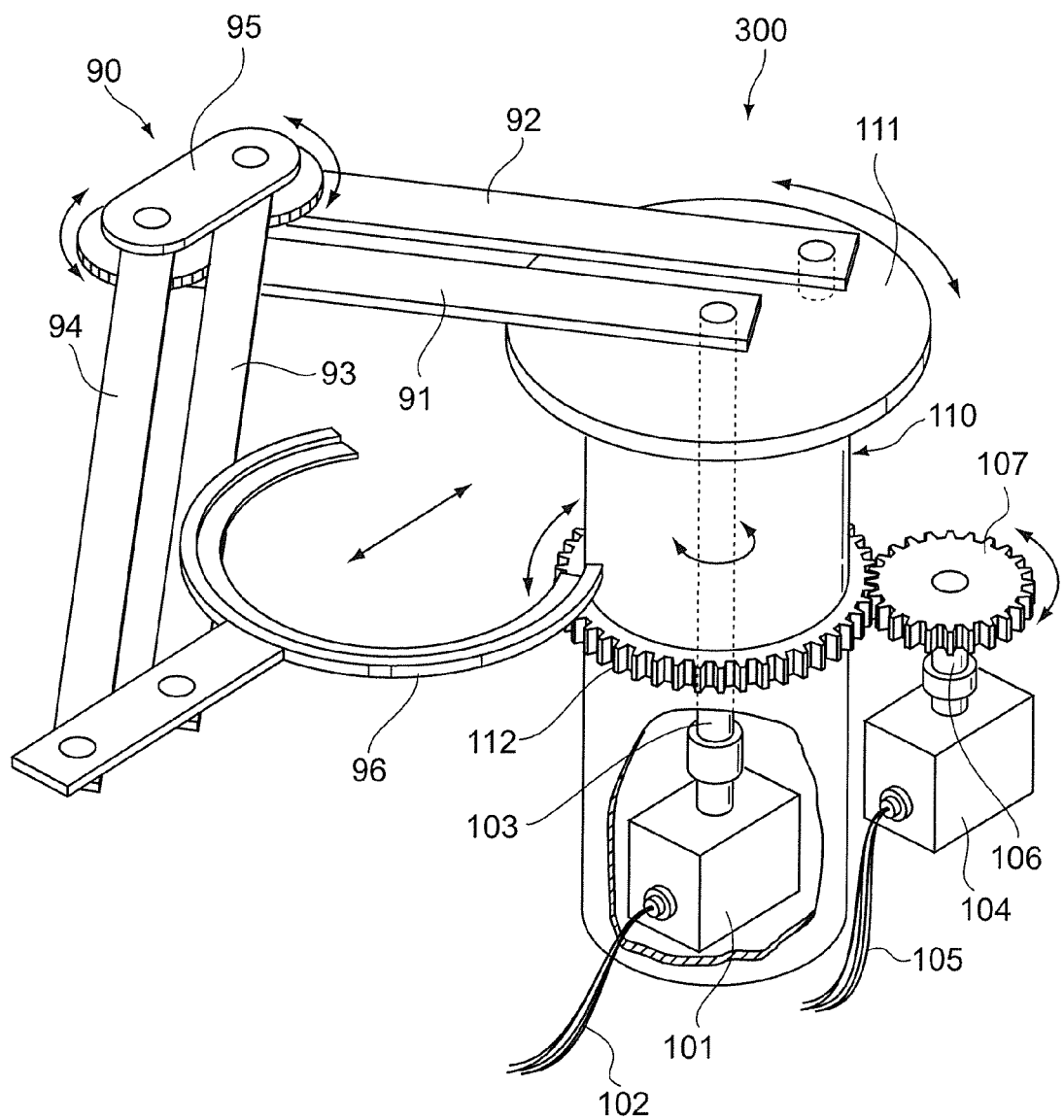
FIG. 9 is a perspective view showing a conveying apparatus according to Comparative Example.

FIG. 9 is a perspective view showing the conveying apparatus 300 according to Comparative Example.

As shown in FIG. 9, the conveying apparatus 300 includes an arm mechanism 90 including a plurality of link bars 91 to 95 and a substrate holding portion 96, a first motor 101 that extends and retracts the arm mechanism 90, a first cable 102 connected to the first motor 101, and an axis 103 that couples a proximal end of the first link bar 91 and the first motor 101.

Further, the conveying apparatus 300 includes a conveying apparatus main body 110 including a turntable 111 and mounting the first motor therein, and a first gear 112 provided to the conveying apparatus main body 110. The conveying apparatus 300 includes a second motor 104 that turns the conveying apparatus main body 110 and the arm mechanism 90, a second cable 105 connected to the second motor, and a second gear 107 engaged with the first gear 112 and provided to an output axis 106 of the second motor 104.

In the conveying apparatus 300, when the first motor 101 is driven, the axis 103 is rotated and the arm mechanism 90 is extended and retracted. Further, when the second motor 104 is driven, the second gear 107 and the first gear 112 are rotated, and the conveying apparatus main body 110 and the arm mechanism 90 are turned.

In the case where the second motor 104 is driven and the arm mechanism 90 is turned, the conveying apparatus main body 110 is rotated together with the arm mechanism 90, and therefore the first motor 101 mounted in the conveying apparatus main body 110 is also rotated at the same time. At this time, the first cable 102 connected to the first motor 101 twines around the conveying apparatus 300. As a result, a burden is placed on the cable and there is a fear that the cable is broken. Further, since the cable twines around the conveying apparatus, there arises a problem that the arm mechanism 90 cannot be turned by 360 degrees or more in one direction.

Here, to avoid the problem of the twined cable, there is conceived a method of dropping the first cable 102 down just as it is. In this case, however, when the arm mechanism 90 is turned, a burden due to the twist is placed on the first cable 102, which causes a fear that the first cable 102 is broken. To reduce the burden due to the twist, which is applied to the first cable 102, it is necessary to drop the first cable 102 down to a lower level. In this case, there arises a problem that the height of the entire conveying apparatus 300 is increased.

Further, to avoid the problem of the twined cable, there is also conceived a method of turning the arm mechanism with use of a belt and a pulley. However, in the case of controlling the turning operation of the arm mechanism with use of a belt and a pulley, a belt tension is changed at a time of a positive or inverse rotation of the pulley, which causes a problem that the turning operation cannot be precisely controlled.

Here, for the improvement of position accuracy, reduction in the number of components, and space saving of the conveying apparatus 300, there is conceived a method of arranging the second motor 104 immediately below the first motor 101 and directly rotating the conveying apparatus main body 110 by the second motor 104. In this case, however, there arises a problem that the first cable 102 twines around the second motor 104.

In the conveying apparatus 100 according to this embodiment, since the upper driving mechanism 40 and the lower driving mechanism 50 are each fixed to the support column 72, the upper driving mechanism 40 itself and the lower driving mechanism 50 itself are not rotated. Therefore, the cables 43 and 53 connected to the upper motor 42 and the lower motor 52 do not twine around the conveying apparatus 100, and thus the problem that the cables 43 and 53 are broken is not caused.

In this manner, the conveying apparatus 100 according to this embodiment can solve the problem of twined cables. This is because, since the hollow portion 60 of the upper rotation-transmitting mechanism 41 is used as a hole for passing the inner shaft 61 therethrough, spatial positions of the upper motor 42 of the upper driving mechanism 40 and the lower motor 52 of the lower driving mechanism 50 do not change and the upper driving mechanism 40 and the lower driving mechanism 50 do not interfere with each other even when the arm mechanism 30 is turned.

In addition, the upper rotation-transmitting mechanism 41 and lower rotation-transmitting mechanism 51, which are mounted to the conveying apparatus 100 according to this embodiment, each have a high deceleration ratio (for example, about 1/500) as described above. Therefore, in this embodiment, the turning operation and the extension and retraction operation of the arm mechanism 30 can be controlled with high precision.

Second Embodiment of Conveying Apparatus

Next, a second embodiment of the conveying apparatus will be described.

Figure 10:
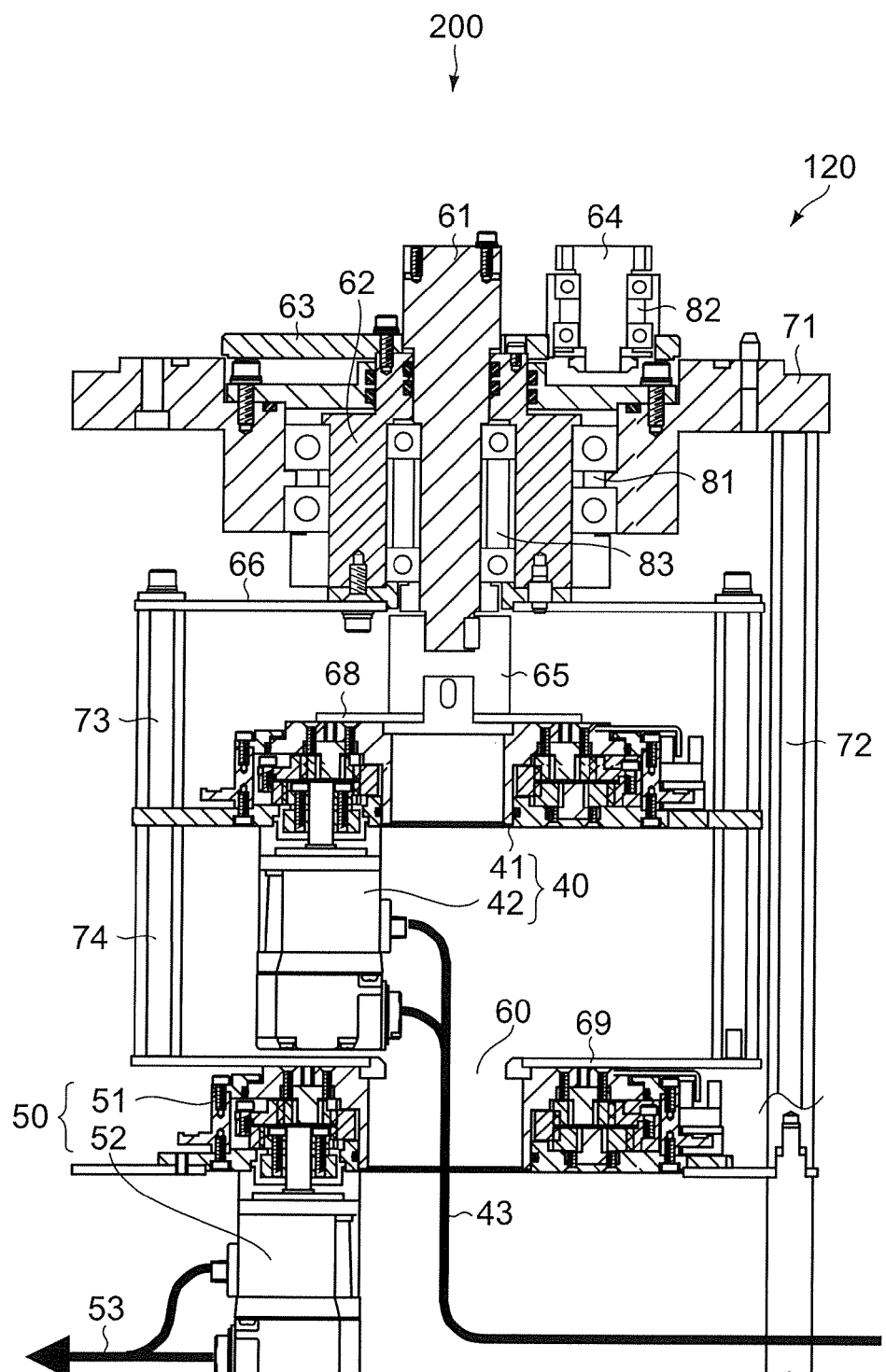
FIG. 10 is a cross-sectional view of a conveying apparatus according to another embodiment, in which the conveying apparatus is laterally viewed.

FIG. 10 is a cross-sectional view showing a conveying apparatus according to a second embodiment of the present invention, in which the conveying apparatus is laterally viewed. The top view of the conveying apparatus according to the second embodiment is the same as FIG. 6 described above, and the cross-sectional side view of the upper driving mechanism or lower driving mechanism is the same as FIG. 8 described above. It should be noted that in the description of a conveying apparatus 200 according to the second embodiment, members having the same functions and structures as those of the conveying apparatus 100 according to the first embodiment described above will be denoted by the same reference symbols, and description thereof will be omitted or simplified.

The conveying apparatus 200 according to the second embodiment is different from the conveying apparatus 100 of the first embodiment described above in that the upper driving mechanism 40 rotates the inner shaft 61 and the lower driving mechanism 50 rotates the outer shaft, and that the hollow portion 60 of the lower rotation-transmitting mechanism 51 is used as a hole for passing the cable 43 therethrough. Therefore, the differences will mainly be described.

As shown in FIG. 10, the conveying apparatus 200 includes the upper driving mechanism 40 including the upper rotation-transmitting mechanism 41 and the upper motor 42, and the lower driving mechanism 50 including the lower rotation-transmitting mechanism 51 and the lower motor 52 and arranged below the upper driving mechanism 40.

The output plate 68 of the upper driving mechanism 40 is coupled to a lower end of the inner shaft 61 via the coupling 65. The output plate 69 of the lower driving mechanism 50 is coupled to a lower portion of the outer shaft 62 via a support column 74, a support column 73, and the turn plate 66.

The upper driving mechanism 40 is fixed to the support column 73 and the support column 74, and the lower driving mechanism 50 is fixed to the support column 72.

The cable 43 connected to the upper motor 42 is drawn out to the outside of the conveying apparatus 200 via the hollow portion 60 of the lower rotation-transmitting mechanism 51. In other words, the hollow portion 60 of the lower rotation-transmitting mechanism 51 is used as a hole for passing the cable 43 of the upper motor 42 therethrough.

Next, the operation of the conveying apparatus 200 will be described.

When the upper motor 42 of the upper driving mechanism 40 is driven, the driving gear 25, the sun gear 21, the ring gear 22, the gear 26, the first planetary gear 23, and the second planetary gear 24 are rotated, and the output axis 44 and the output plate 68 are rotated at a predetermined deceleration ratio (for example, about 1/500). When the output plate 68 is rotated, the inner shaft 61 connected to the output plate 68 via the coupling 65 is rotated, and the arm mechanism 30 is extended and retracted.

On the other hand, when the lower motor 52 of the lower driving mechanism 50 is driven, the output plate 69 of the lower rotation-transmitting mechanism 51, the support column 74, the support column 73, the upper driving mechanism 40, the turn plate 66, the outer shaft 62, and the turntable 63 are rotated, and the arm mechanism 30 is turned.

When the lower motor 52 is driven and the arm mechanism 30 is turned, the upper driving mechanism 40 itself is rotated, and therefore the upper motor 42 and the cable 43 connected to the upper motor 42 are also rotated at the same time.

In the conveying apparatus 200, however, the hollow portion 60 of the lower rotation-transmitting mechanism 51 is used as a hole for passing the cable 43 therethrough, which can prevent the cable 43 from twining around the conveying apparatus 200. Accordingly, it is possible to prevent the cable 43 from being broken. In addition, since the rotation-transmitting mechanisms 41 and 51 having a high deceleration ratio are also used in the conveying apparatus 200 similar to the conveying apparatus 100 according to the first embodiment, the turning operation and the extension and retraction operation of the arm mechanism 30 can be controlled with high precision.

Embodiment of Driving Apparatus

Next, a driving apparatus equipped with a rotation-transmitting mechanism will be described.

As described above, in the rotation-transmitting mechanism 10 (or rotation-transmitting mechanism 20, 41, or 51, the same applies below), a high deceleration ratio is achieved with a simple structure, and downsizing and thinning are also easily achieved. The rotation-transmitting mechanism 10 can be used in various types of driving apparatuses, in addition to the conveying apparatuses 100 and 200 described above.

In this embodiment, the utilization form of the rotation-transmitting mechanism 10 will be described using examples of various driving apparatuses.

Figure 11:
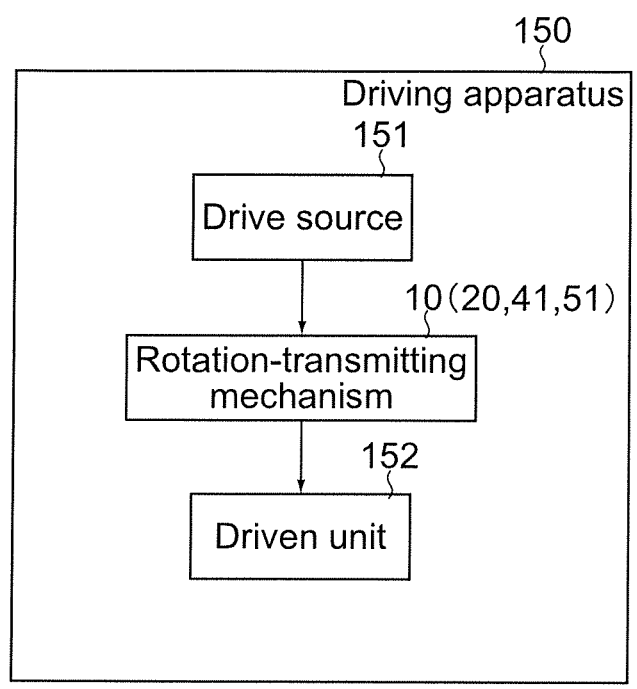
FIG. 11 is a functional block diagram showing the structure of a driving apparatus according to an embodiment of the present invention.

FIG. 11 is a functional block diagram showing the structure of a driving apparatus.

As shown in FIG. 11, a driving apparatus 150 includes a drive source 151 constituted of a motor or the like, a rotation-transmitting mechanism 10, and a driven unit 152 driven by the drive source 151 via the rotation-transmitting mechanism 10.

As the driving apparatus 150, in addition to the conveying apparatuses 100 and 200, for example, an X-axis table apparatus movable in a uniaxial direction, an XY-axis table apparatus movable in a biaxial direction in a plane, an XYZ-axis table apparatus movable in directions of three axes orthogonal to one another, a rotary table apparatus, a hoisting and lowering apparatus, a humanoid robot, an animal type robot, a rescue robot, an engineering apparatus, an electric cylinder, an electric jack, a conveyor belt, a crane, a forklift, and the like are exemplified. Further, as the driving apparatus 150, a radio control apparatus, an automatic door, an automatic pump, an air blower, a printing apparatus, a vending machine, an automatic ticket gate, an elevator, an escalator, an automatic fishing reel, and the like are exemplified.

It should be noted that the driving apparatus 150 is not limited to the above examples. The driving apparatus 150 exemplified as a utilization form of the rotation-transmitting mechanism 10 may be typically any apparatus as long as it is an apparatus driven by the drive source 151.

The rotation-transmitting mechanism 10 outputs, to the driven unit 152, an input from the drive source 151 at a high deceleration ratio.

The driven unit 152 is a member driven by the output of the rotation-transmitting mechanism 10. The driven unit 152 is different depending on the type of the driving apparatus 150.

For example, in the case where the driving apparatus 150 is a rotary table apparatus, the driven unit 152 is a rotary table, and in the case where the driving apparatus 150 is a hoisting and lowering apparatus, the driven unit 152 is a drum for hoisting a rope by rotation. In the case where the driving apparatus 150 is a humanoid robot or an animal type robot, the driven unit 152 is a joint portion, for example. Further, in the case where the driving apparatus 150 is an X-axis table apparatus, the driven unit 152 is an X-axis table, and in the case where the driving apparatus 150 is an electric cylinder or electric jack, the driven unit 152 is a rod.

There are cases where the driven unit 152 is rotated by the output of the rotation-transmitting mechanism 10 and where the driven unit 152 is linearly moved by the output of the rotation-transmitting mechanism 10.

In the case where the driven unit 152 is rotated, by the high deceleration ratio of the rotation-transmitting mechanism 10, the driven unit 152 can be rotation-controlled (position-controlled) with high precision. For example, a rotary table can be rotation-controlled with high precision, or a joint portion of a humanoid robot can be rotation-controlled with high precision. Further, by the high deceleration ratio of the rotation-transmitting mechanism 10, the driven unit 152 can be rotated by a strong force (torque). For example, a drum of a hoisting and lowering apparatus can be rotated by a strong force. In this case, even when a motor with small power is used as the drive source 151, a hoisting and lowering apparatus with large power can be obtained.

In the case where the driven unit 152 is linearly moved, the rotation movement of the rotation-transmitting mechanism 10 is converted into a linear movement by a ball screw, for example. In this case, by the high deceleration ratio of the rotation-transmitting mechanism, the driven unit 152 can be linearly controlled (position-controlled) with high precision. For example, an X-axis table of an X-axis table apparatus can be linearly controlled (position-controlled) with high precision.

Further, by the high deceleration ratio of the rotation-transmitting mechanism, the driven unit 152 can be linearly driven by a high propulsive force. For example, a rod of an electric cylinder or electric jack can be linearly driven by a high propulsive force. In this case, even when a motor with small power is used as the drive source, an electric cylinder, an electric jack, or the like with large power can be obtained.

It should be noted that the hollow portion 9 (or hollow portion 60) of the rotation-transmitting mechanism 10 (or rotation-transmitting mechanism 20, 41, or 51) can be used in various applications as a hole for passing a cable or a pipe for cold water therethrough. However, the hollow portion 9 may not necessarily be provided to the rotation-transmitting mechanism 10. Even if the rotation-transmitting mechanism 10 is not provided with the hollow portion 9, the driven unit 142 can be position-controlled with high precision or driven by a high propulsive force.

Various Modified Examples

Embodiments according to the present invention are not limited to the embodiments described above and can be variously modified.

In the embodiments described above, the upper rotation-transmitting mechanism 41 and the lower rotation-transmitting mechanism 51 used in the conveying apparatus 100 (or conveying apparatus 200, the same applies below) are formed of gears. However, without being limited to the above, the rotation-transmitting mechanisms 41 and 51 used in the conveying apparatus 100 may be formed of rotating bodies as a matter of course.

In the embodiments described above, the relative positions of the driving rotating body 5 (or driving gear 25, the same applies below) and the rotating body 6 (or gear 26, the same applies below) are distant from each other by 180 degrees around the axis O-O'. However, the relative positions may not necessarily be distant by 180 degrees around the axis O-O'. The same holds true for the relative positions of the first planetary rotating body and the second planetary rotating body.

In the embodiments described above, the number of planetary rotating bodies 3 and 4 is two. However, without being limited thereto, the number of planetary rotating bodies may be two or more. Similarly, the number of driving rotating body 5 and rotating body 6 may be two or more.

The invention claimed is:

1. A rotation-transmitting mechanism with a first stage and a second stage, comprising:
    a first rotating body having a center axis of rotation about which the first rotating body is rotatable, the first rotating body including a first outer circumferential portion provided in the first stage and a second outer circumferential portion provided in the second stage, the first rotating body being formed such that a distance from the center axis of rotation to the first outer circumferential portion and a distance from the center axis of rotation to the second outer circumferential portion are different from each other;
    a second rotating body rotatable about the center axis of rotation and including a first inner circumferential portion opposed to the first outer circumferential portion in the first stage and a second inner circumferential portion opposed to the second outer circumferential portion in the second stage, the second rotating body being formed such that a distance from the center axis of rotation to the first inner circumferential portion and a distance from the center axis of rotation to the second inner circumferential portion are different from each other;
    a driving rotating body that is brought into contact with the first outer circumferential portion and the first inner circumferential portion in the first stage, fixed to an output shaft of a motor at a position offset from the center axis of rotation, and directly rotated by the motor;
    a plurality of planetary rotating bodies that are brought into contact with the second outer circumferential portion and the second inner circumferential portion in the second stage and revolve around the first rotating body;
    an output portion to output revolution movements of the plurality of planetary rotating bodies; and
    a hollow portion that is formed at the center axis of rotation to form a path through the rotation-transmitting mechanism extending along the center axis of rotation.

2. The rotation-transmitting mechanism according to claim 1, wherein
    the first rotating body, the second rotating body, the driving rotating body, and the planetary rotating bodies are formed of gears.

3. A conveying apparatus, comprising:
    an extensible arm mechanism including a placing portion for placing an object to be conveyed; and
    a first rotation-transmitting mechanism with a first stage and a second stage, including
    a first rotating body having a center axis of rotation about which the first rotating body is rotatable, the first rotating body including a first outer circumferential portion provided in the first stage and a second outer circumferential portion provided in the second stage, the first rotating body being formed such that a distance from the center axis of rotation to the first outer circumferential portion and a distance from the center axis of rotation to the second outer circumferential portion are different from each other,
    a second rotating body rotatable about the center axis of rotation and including a first inner circumferential portion opposed to the first outer circumferential portion in the first stage and a second inner circumferential portion opposed to the second outer circumferential portion in the second stage, the second rotating body being formed such that a distance from the center axis of rotation to the first inner circumferential portion and a distance from the center axis of rotation to the second inner circumferential portion are different from each other,
    a driving rotating body that is brought into contact with the first outer circumferential portion and the first inner circumferential portion in the first stage, fixed to an output shaft of a motor at a position offset from the center axis of rotation, and directly rotated by the motor,
    a plurality of planetary rotating bodies that are brought into contact with the second outer circumferential portion and the second inner circumferential portion in the second stage and revolve around the first rotating body,
    an output portion to output revolution movements of the plurality of planetary rotating bodies to the arm mechanism so that the arm mechanism is extended and retracted, and
    a hollow portion that is formed at the center axis of rotation to form a path through the rotation-transmitting mechanism extending along the center axis of rotation.

4. The conveying apparatus according to claim 3, further comprising
    a second rotation-transmitting mechanism with a first stage and a second stage, including
    a first rotating body having a center axis of rotation about which the first rotating body is rotatable, the first rotating body including a first outer circumferential portion provided in the first stage and a second outer circumferential portion provided in the second stage, the first rotating body being formed such that a distance from the center axis of rotation to the first outer circumferential portion and a distance from the center axis of rotation to the second outer circumferential portion are different from each other,
    a second rotating body rotatable about the center axis of rotation and including a first inner circumferential portion opposed to the first outer circumferential portion in the first stage and a second inner circumferential portion opposed to the second outer circumferential portion in the second stage, the second rotating body being formed such that a distance from the center axis of rotation to the first inner circumferential portion and a distance from the center axis of rotation to the second inner circumferential portion are different from each other,
    a driving rotating body that is brought into contact with the first outer circumferential portion and the first inner circumferential portion in the first stage, fixed to an output shaft of a drive source, and directly rotated by the drive source, a plurality of planetary rotating bodies that are brought into contact with the second outer circumferential portion and the second inner circumferential portion in the second stage and revolve around the first rotating body, an output portion to output revolution movements of the plurality of planetary rotating bodies to the arm mechanism so that the arm mechanism is turned and a hollow portion that is formed at the center axis of rotation to form a path through the second rotation-transmitting mechanism extending along the center axis of rotation.

5. The conveying apparatus according to claim 4, further comprising:

an inner shaft that is rotatable and transmits a rotation movement of the output portion of the first rotation-transmitting mechanism to the arm mechanism; and an outer shaft that is rotatable, arranged coaxially with the inner shaft on the outside of the inner shaft, and transmits a rotation movement of the output portion of the second rotation-transmitting mechanism to the arm mechanism.

6. The conveying apparatus according to claim 5, wherein the second rotation-transmitting mechanism is arranged above the first rotation-transmitting mechanism coaxially with the first rotation-transmitting mechanism, and the inner shaft is coupled to the arm mechanism and the output portion of the first rotation-transmitting mechanism via the hollow portion of the second rotation-transmitting mechanism.

7. The conveying apparatus according to claim 5, wherein the second rotation-transmitting mechanism is arranged below the first rotation-transmitting mechanism coaxially with the first rotation-transmitting mechanism, and the hollow portion of the second rotation-transmitting mechanism is used as a hole for passing a cable therethrough, the cable being connected to the drive source that drives the first rotation-transmitting mechanism.

8. A driving apparatus comprising:

a rotation-transmitting mechanism with a first stage and a second stage, including a first rotating body having a center axis of rotation about which the first rotating body is rotatable, the first rotating body including a first outer circumferential portion provided in the first stage and a second outer circumferential portion provided in the second stage, the first rotating body being formed such that a distance from the center axis of rotation to the first outer circumferential portion and a distance from the center axis of rotation to the second outer circumferential portion are different from each other;

a second rotating body rotatable about the center axis of rotation and including a first inner circumferential portion opposed to the first outer circumferential portion in the first stage and a second inner circumferential portion opposed to the second outer circumferential portion in the second stage, the second rotating body being formed such that a distance from the center axis of rotation to the first inner circumferential portion and a distance from the center axis of rotation to the second inner circumferential portion are different from each other;

a driving rotating body that is brought into contact with the first outer circumferential portion and the first inner circumferential portion in the first stage, fixed to an output shaft of a motor at a position offset from the center axis of rotation, and directly rotated by the motor;

a plurality of planetary rotating bodies that are brought into contact with the second outer circumferential portion and the second inner circumferential portion in the second stage and revolve around the first rotating body; and a hollow portion that is formed at the center axis of rotation to form a path through the rotation-transmitting mechanism extending along the center axis of rotation; and a driven unit driven by an output of the rotation-transmitting mechanism due to the revolution of the plurality of planetary rotating bodies.

9. A concentric biaxial rotation-transmitting structure, comprising:

a first rotation-transmitting mechanism with a first stage and a second stage, including a first rotating body having a center axis of rotation about which the first rotating body is rotatable, the first rotating body including a first outer circumferential portion provided in the first stage and a second outer circumferential portion provided in the second stage, the first rotating body being formed such that a distance from the center axis of rotation to the first outer circumferential portion and a distance from the center axis of rotation to the second outer circumferential portion are different from each other, a second rotating body rotatable about the center axis of rotation and including a first inner circumferential portion opposed to the first outer circumferential portion in the first stage and a second inner circumferential portion opposed to the second outer circumferential portion in the second stage, the second rotating body being formed such that a distance from the center axis of rotation to the first inner circumferential portion and a distance from the center axis of rotation to the second inner circumferential portion are different from each other, a driving rotating body that is brought into contact with the first outer circumferential portion and the first inner circumferential portion in the first stage, fixed to an output shaft of a motor at a position offset from the center axis of rotation, and directly rotated by the motor, a plurality of planetary rotating bodies that are brought into contact with the second outer circumferential portion and the second inner circumferential portion in the second stage and revolve around the first rotating body, and a hollow portion that is formed at the center axis of rotation to form a path through the first rotation-transmitting mechanism extending along the center axis of rotation;

a second rotation-transmitting mechanism with a first stage and a second stage, including a first rotating body rotatable about the center axis of rotation and including a first outer circumferential portion provided in the first stage and a second outer circumferential portion provided in the second stage, the first rotating body being formed such that a distance from the center axis of rotation to the first outer circumferential portion and a distance from the center axis of rotation to the second outer circumferential portion are different from each other, a second rotating body rotatable about the center axis of rotation and including a first inner circumferential portion opposed to the first outer circumferential portion in the first stage and a second inner circumferential portion opposed to the second outer circumferential portion in the second stage, the second rotating body being formed such that a distance from the center axis of rotation to the first inner circumferential portion and a distance from the center axis of rotation to the second inner circumferential portion are different from each other, a driving rotating body that is brought into contact with the first outer circumferential portion and the first inner circumferential portion in the first stage, fixed to an output shaft of a drive source, and directly rotated by the drive source, a plurality of planetary rotating bodies that are brought into contact with the second outer circumferential portion and the second inner circumferential portion in the second stage and revolve around the first rotating body, and a hollow portion that is formed at the center axis of rotation to form a path through the second rotation-transmitting mechanism extending along the center axis of rotation, the second rotation-transmitting mechanism being arranged above the first rotation-transmitting mechanism coaxially with the first rotation-transmitting mechanism;

an inner shaft that is rotatable, transmits an output by the revolution of the plurality of planetary rotating bodies of the first rotation-transmitting mechanism to a driven unit, and is coupled to the driven unit and an output side of the first rotation-transmitting mechanism via the hollow portion of the second rotation-transmitting mechanism; and an outer shaft that is arranged coaxially with the inner shaft on the outside of the inner shaft, and transmits an output by the revolution of the plurality of planetary rotating bodies of the second rotation-transmitting mechanism to the driven unit.

* * * * *